(12) United States Patent
Guo et al.

(10) Patent No.: US 11,881,271 B2
(45) Date of Patent: Jan. 23, 2024

(54) NON-VOLATILE MEMORY WITH ENGINEERED CHANNEL GRADIENT

(71) Applicant: SanDisk Technologies LLC, Addison, TX (US)

(72) Inventors: Jiacen Guo, Sunnyvale, CA (US); Xiang Yang, Santa Clara, CA (US); Xiaochen Zhu, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 130 days.

(21) Appl. No.: 17/828,685

(22) Filed: May 31, 2022

(65) Prior Publication Data

US 2023/0386585 A1    Nov. 30, 2023

(51) Int. Cl.
*G11C 16/34* (2006.01)
*G11C 16/26* (2006.01)
*G11C 16/08* (2006.01)
*G11C 16/04* (2006.01)

(52) U.S. Cl.
CPC ...... *G11C 16/3427* (2013.01); *G11C 16/0483* (2013.01); *G11C 16/08* (2013.01); *G11C 16/26* (2013.01)

(58) Field of Classification Search
CPC . G11C 16/3427; G11C 16/0483; G11C 16/08; G11C 16/26
See application file for complete search history.

(56) References Cited

U.S. PATENT DOCUMENTS

| 8,982,637 | B1 | 3/2015 | Dong |
| 9,361,993 | B1* | 6/2016 | Chen ............... G11C 16/3422 |
| 9,747,992 | B1 | 8/2017 | Chen |
| 10,210,941 | B1* | 2/2019 | Chen ............... G11C 11/5642 |
| 10,217,518 | B1 | 2/2019 | Chen |
| 10,235,294 | B1 | 3/2019 | Lu |
| 10,629,272 | B1 | 4/2020 | Lu |
| 11,049,578 | B1 | 6/2021 | Murai |
| 11,139,030 | B1* | 10/2021 | Prakash ............ G11C 16/3422 |
| 11,189,337 | B1 | 11/2021 | Lien |
| 2019/0057749 | A1* | 2/2019 | Chen ..................... G11C 16/08 |
| 2020/0258558 | A1* | 8/2020 | Prakash ........... G11C 11/06057 |

* cited by examiner

*Primary Examiner* — Jay W. Radke
(74) *Attorney, Agent, or Firm* — Vierra Magen Marcus LLP

(57) ABSTRACT

To save power during a read process, NAND strings of each sub-block of a block have independently controlled source side select lines connected to source side select gates and drain side select lines connected to drain side select gates so that NAND strings of unselected sub-blocks can float and not draw current. To prevent read disturb in NAND strings of unselected sub-blocks, after all word lines are raised to a pass gate voltage, unselected word lines nearby the selected word line are lowered to respective intermediate voltages while lowering the voltage on the selected word line in order to achieve a channel potential gradient in the floated NAND strings of the unselected sub-blocks that does not result in read disturb. Subsequently, the selected word line is raised to the appropriate read compare voltage so the selected memory cells can be sensed.

20 Claims, 27 Drawing Sheets

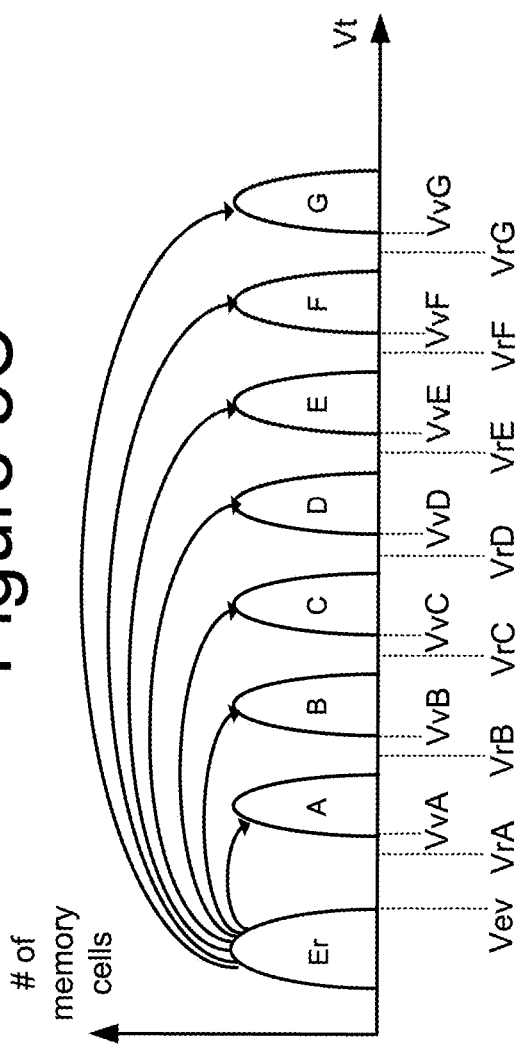
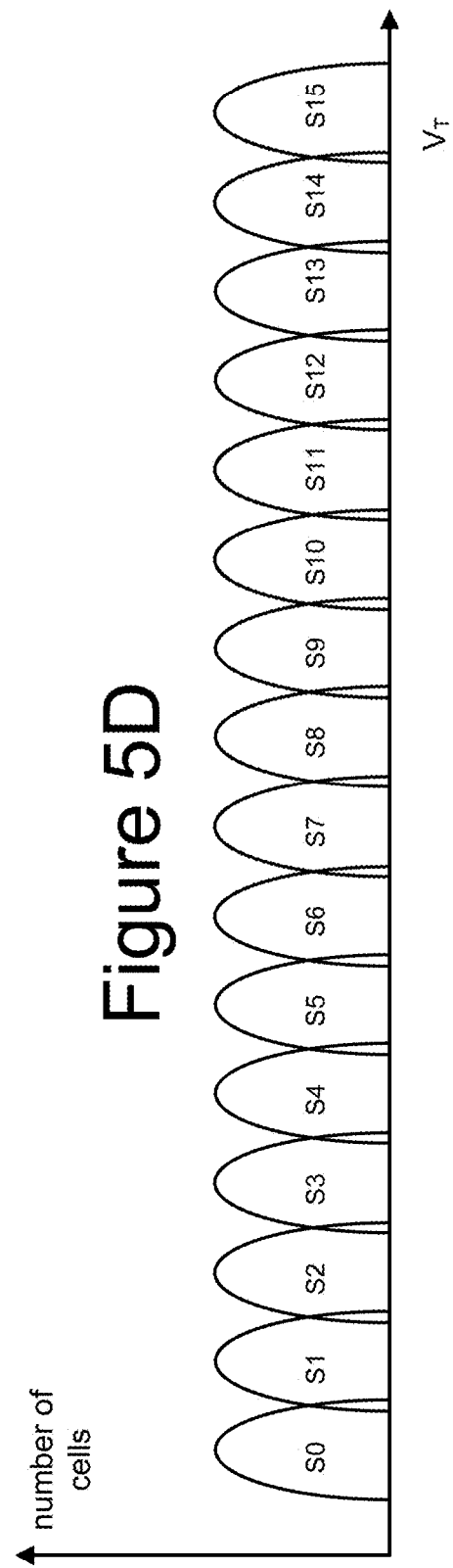

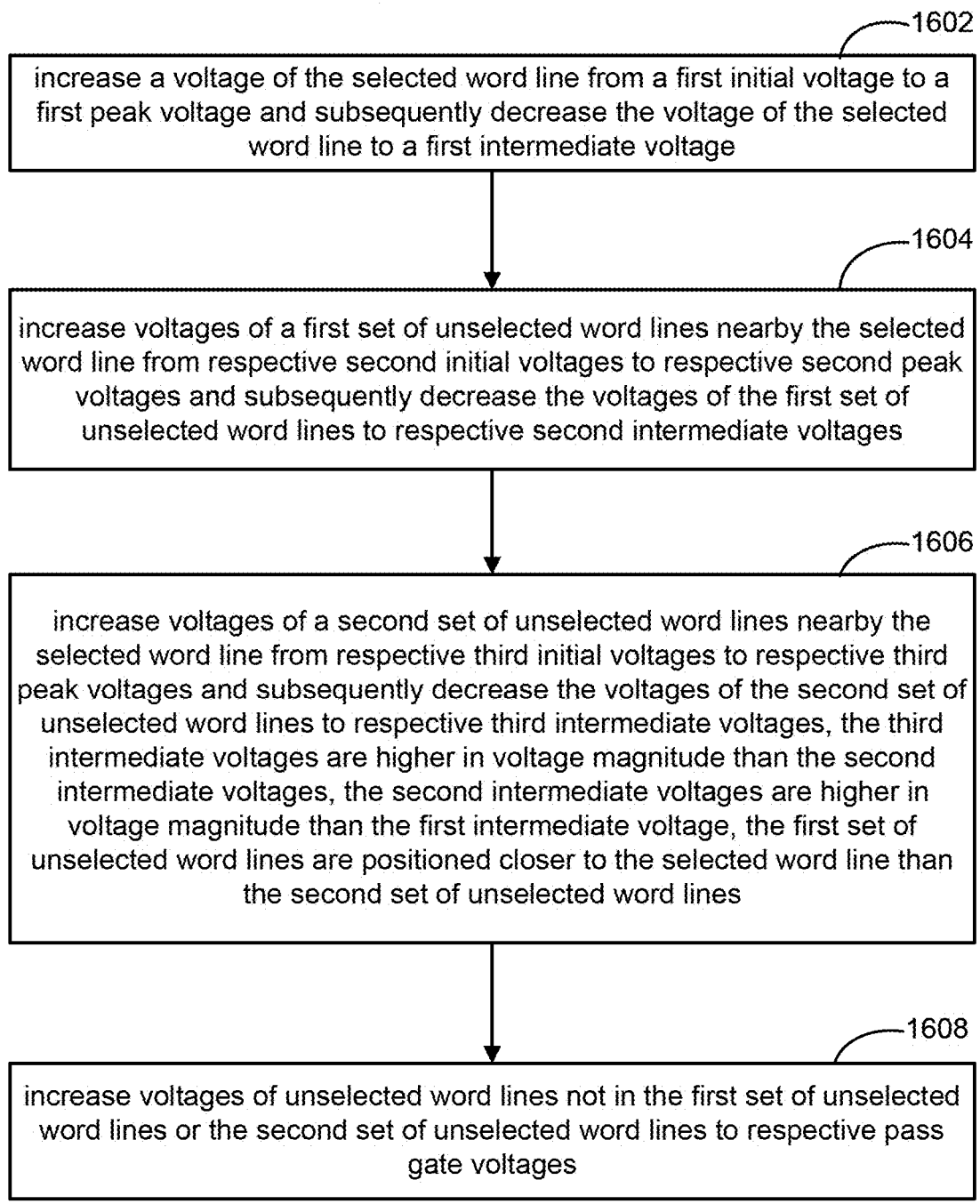

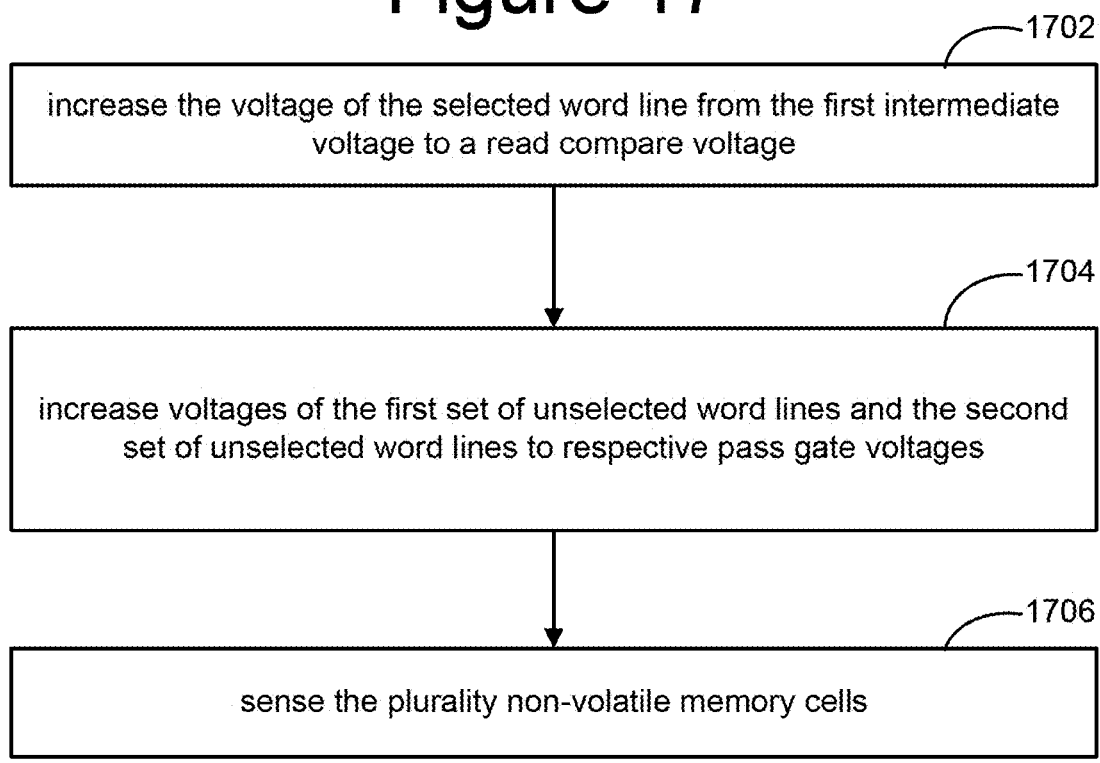

NON-VOLATILE MEMORY WITH ENGINEERED CHANNEL GRADIENT

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that the data can be read back successfully.

BRIEF DESCRIPTION OF THE DRAWINGS

Like-numbered elements refer to common components in the different figures.

FIG. 5C depicts threshold voltage distributions.
FIG. 5D depicts threshold voltage distributions.

FIG. 16 is a flow chart describing one embodiment of a channel discharge process.

FIG. 17 is a flow chart describing of a process performed for sensing data.

DETAILED DESCRIPTION

As will be described in more detail below, a non-volatile memory is divided into blocks, and the blocks are divided into sub-blocks. To save power, NAND strings of each sub-block of a block have independently controlled source side select lines connected to source side select gates and independently controlled drain side select lines connected to drain side select gates so that NAND strings of unselected sub-blocks can float during a read process and, thereby, not draw any current. To prevent read disturb in NAND strings of the unselected sub-blocks in such an arrangement, after voltages of all word lines are raised to a pass gate voltage, voltages of unselected word lines nearby a selected word line are lowered to respective intermediate voltages while lowering the voltage on the selected word line (as part of a transition on the selected word line from the pass gate voltage to a read compare voltage) in order to achieve a channel potential gradient in floated NAND strings of the unselected sub-blocks that does not result in read disturb. Subsequently, the voltage of the selected word line is raised to a read compare voltage, voltages of the unselected word lines nearby the selected word line are raised to the pass gate voltage (such that all unselected word lines are at the pass gate voltage) and the memory cells connected to the selected word line in the selected sub-block are sensed in response to the read compare voltage.

Figure 1:
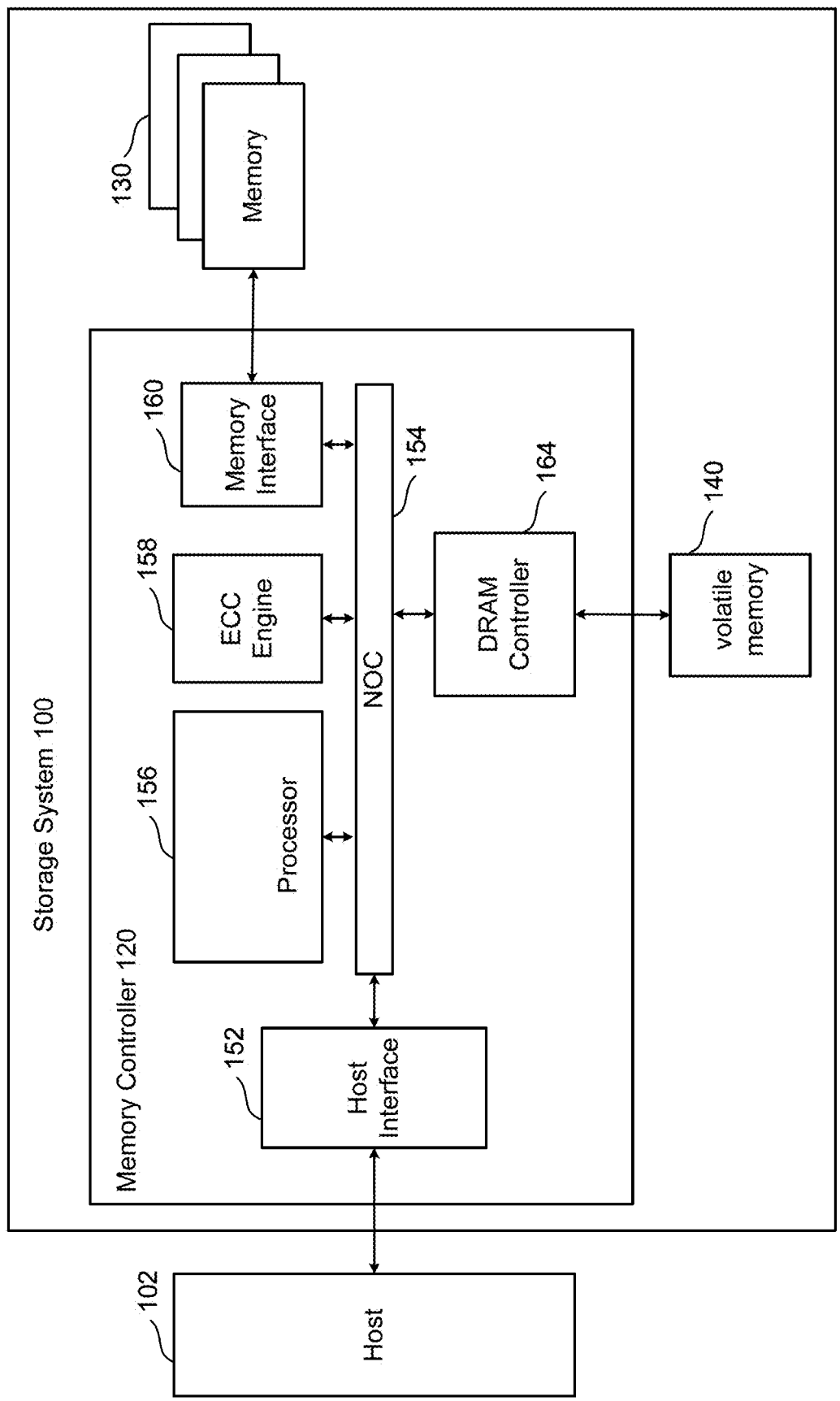
FIG. 1 is a block diagram depicting one embodiment of a storage system.

FIG. 1 is a block diagram of one embodiment of a non-volatile storage system 100 that implements the proposed technology described herein. In one embodiment, non-volatile storage system 100 is a solid state drive ("SSD"). Non-volatile storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
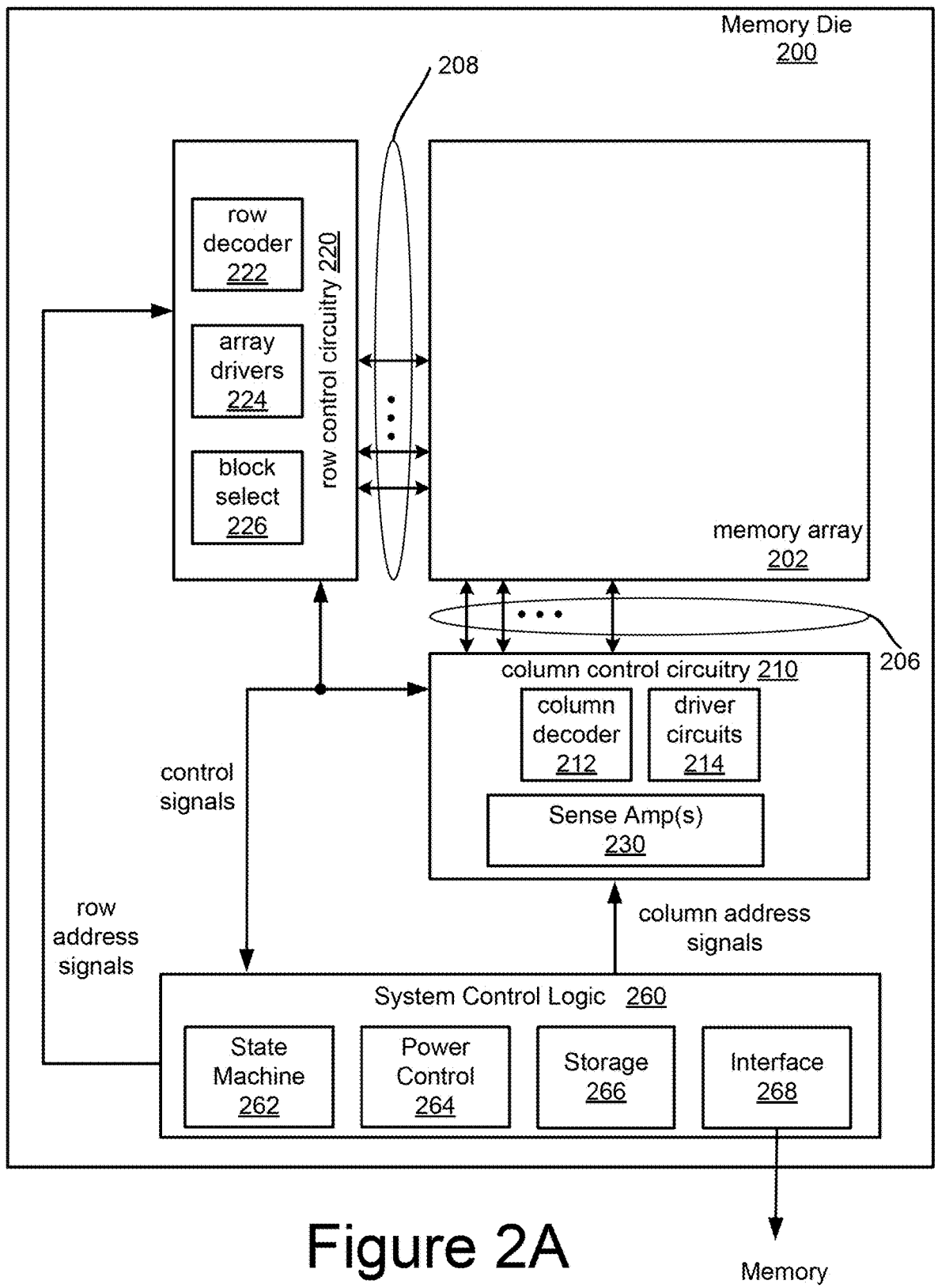
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366

(e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ CMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
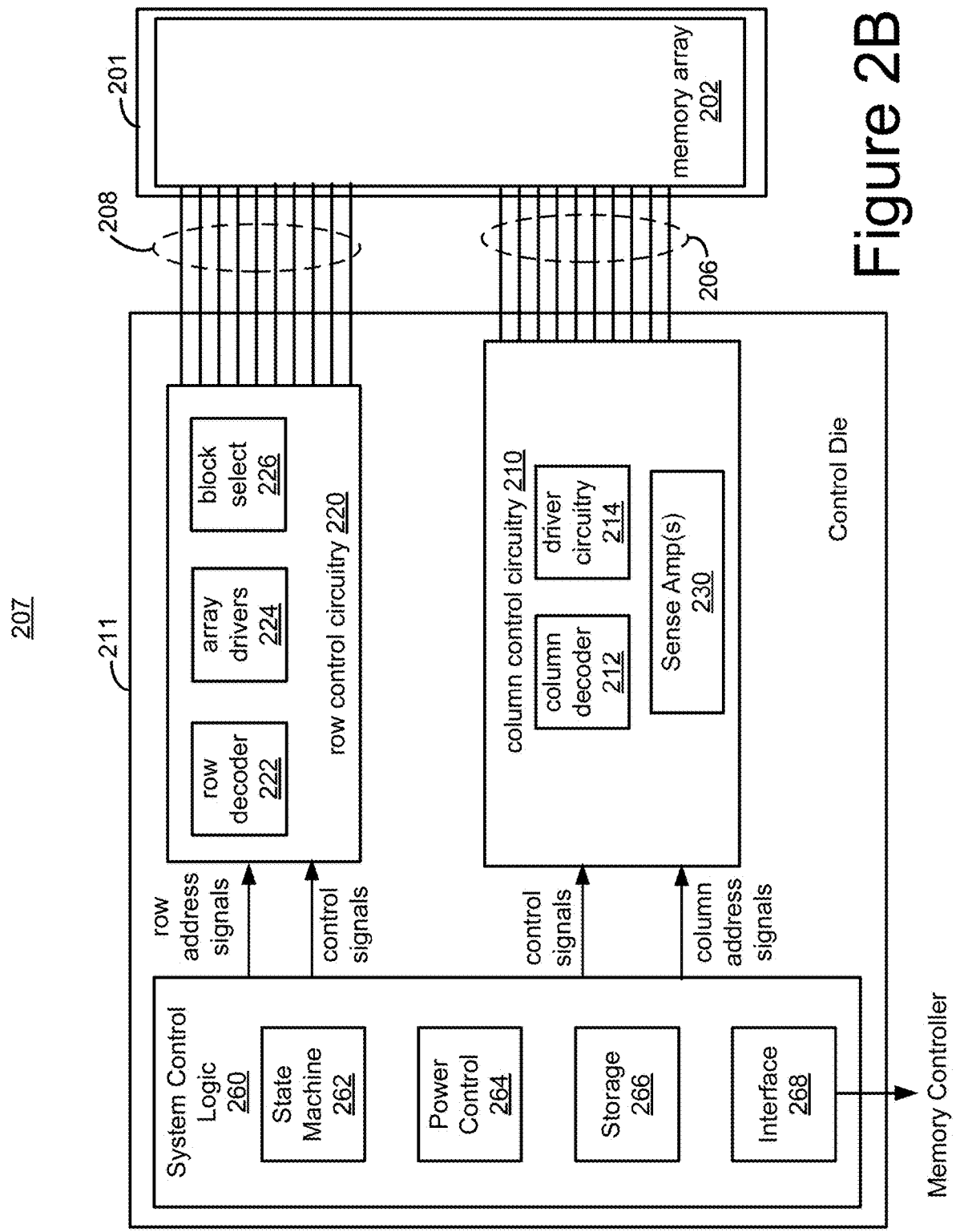
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212 and driver circuitry 214, and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
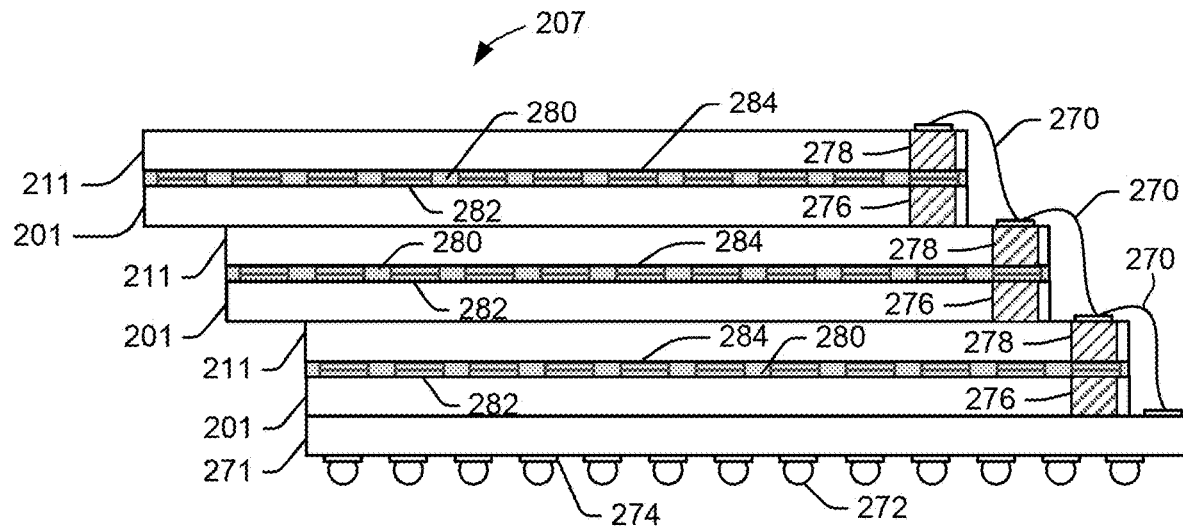
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving bond pads at each level uncovered and accessible from above. Wire bonds 270 connected to the uncovered bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
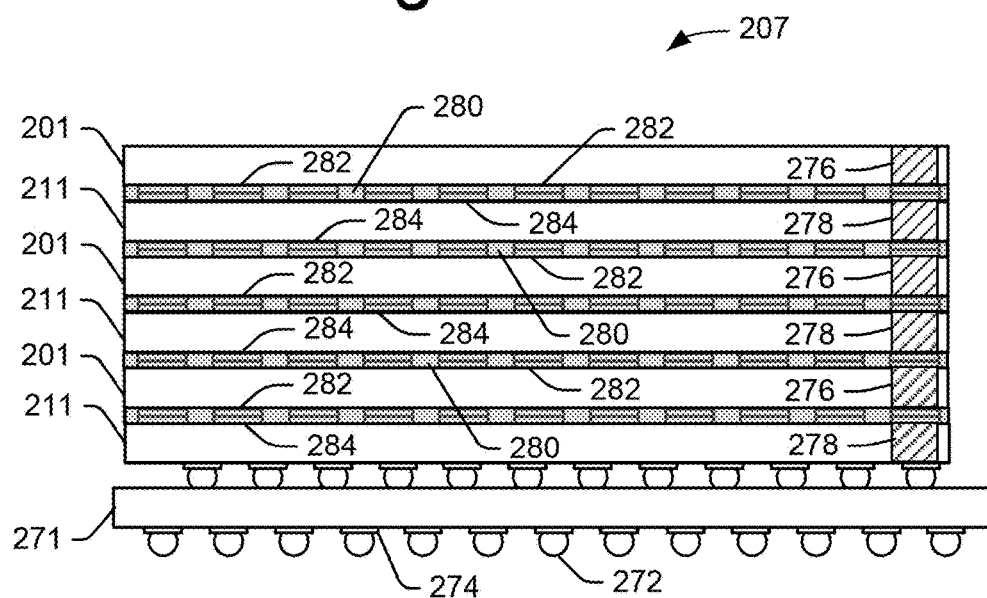

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
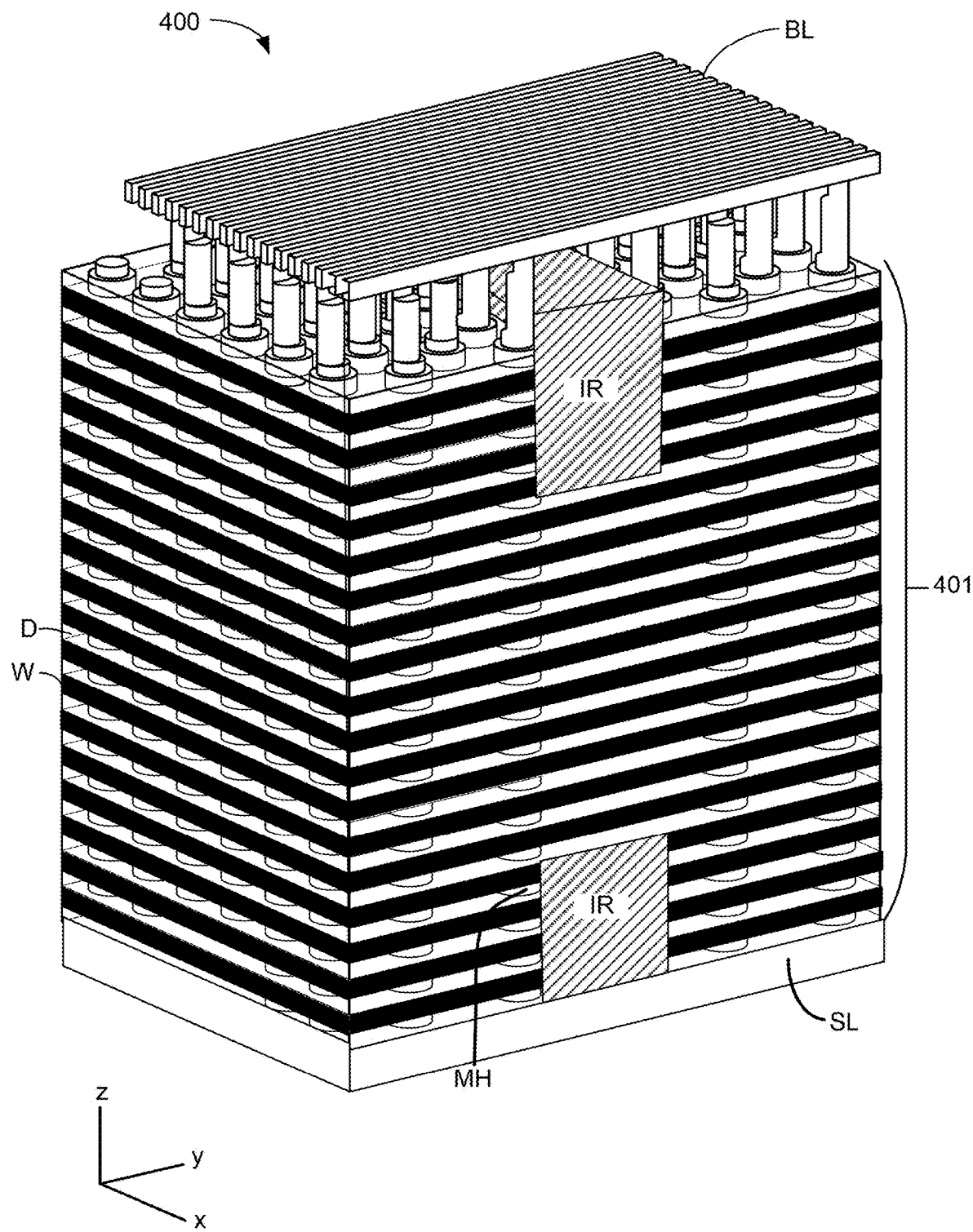
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions by isolation regions IR. FIG. 4 shows two isolation regions IR separating two regions. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
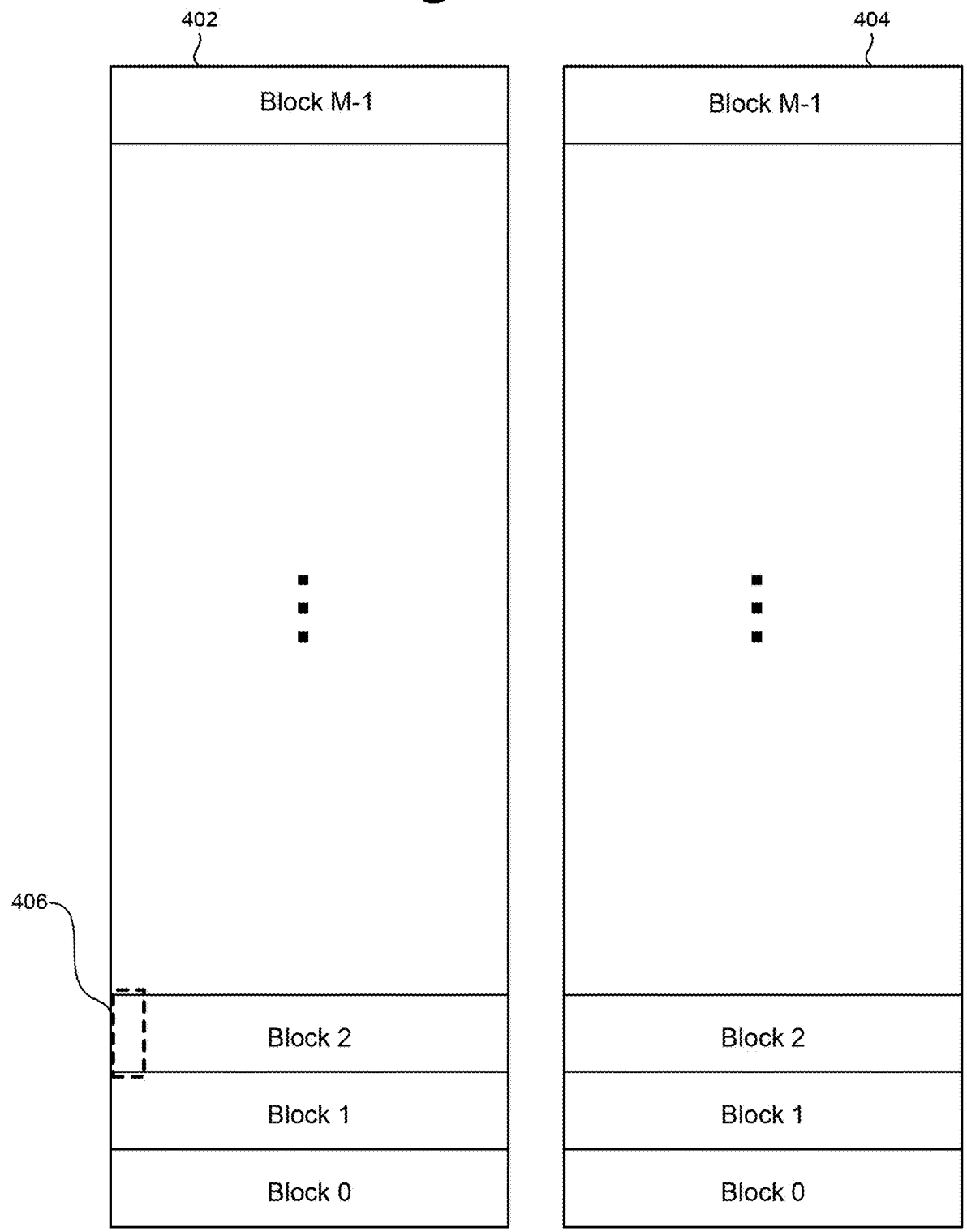
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents groups of connected memory cells such that the memory cells of a block share a common set of word lines. For example, the word lines for a block are all connected to all the vertical NAND strings for that block. Although FIG. 4A shows two planes 402/404, more or less than two planes can be implemented. In some embodiments, memory structure 202 includes four planes, eight planes or more than eight planes.

Figure 4B:
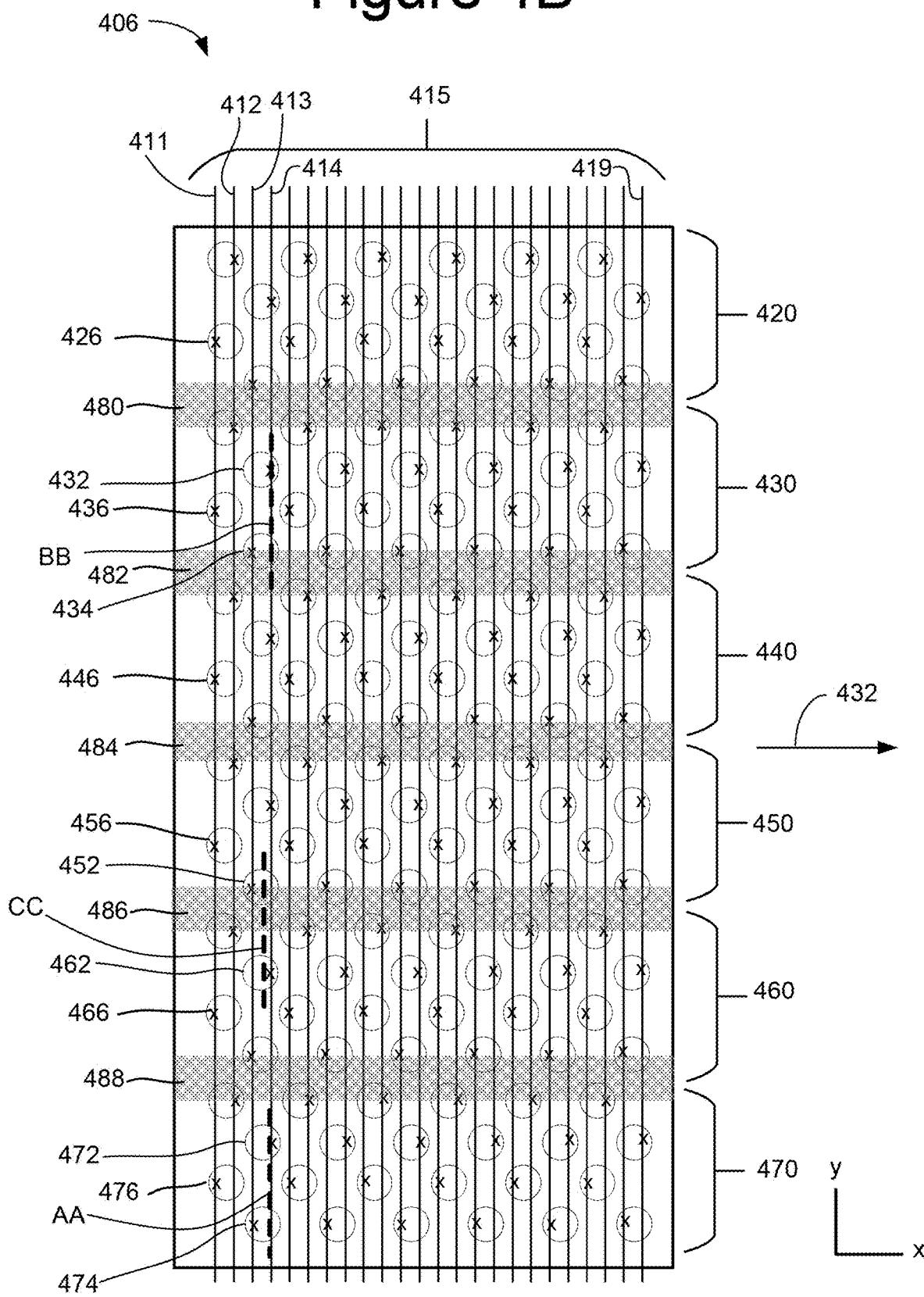
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of SiO$_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470. In one embodiment, the isolation regions only divide the layers used to implement select gates so that NAND strings in different regions can be independently selected. In one example implementation, a bit line only connects to one vertical column/NAND string in each of regions 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
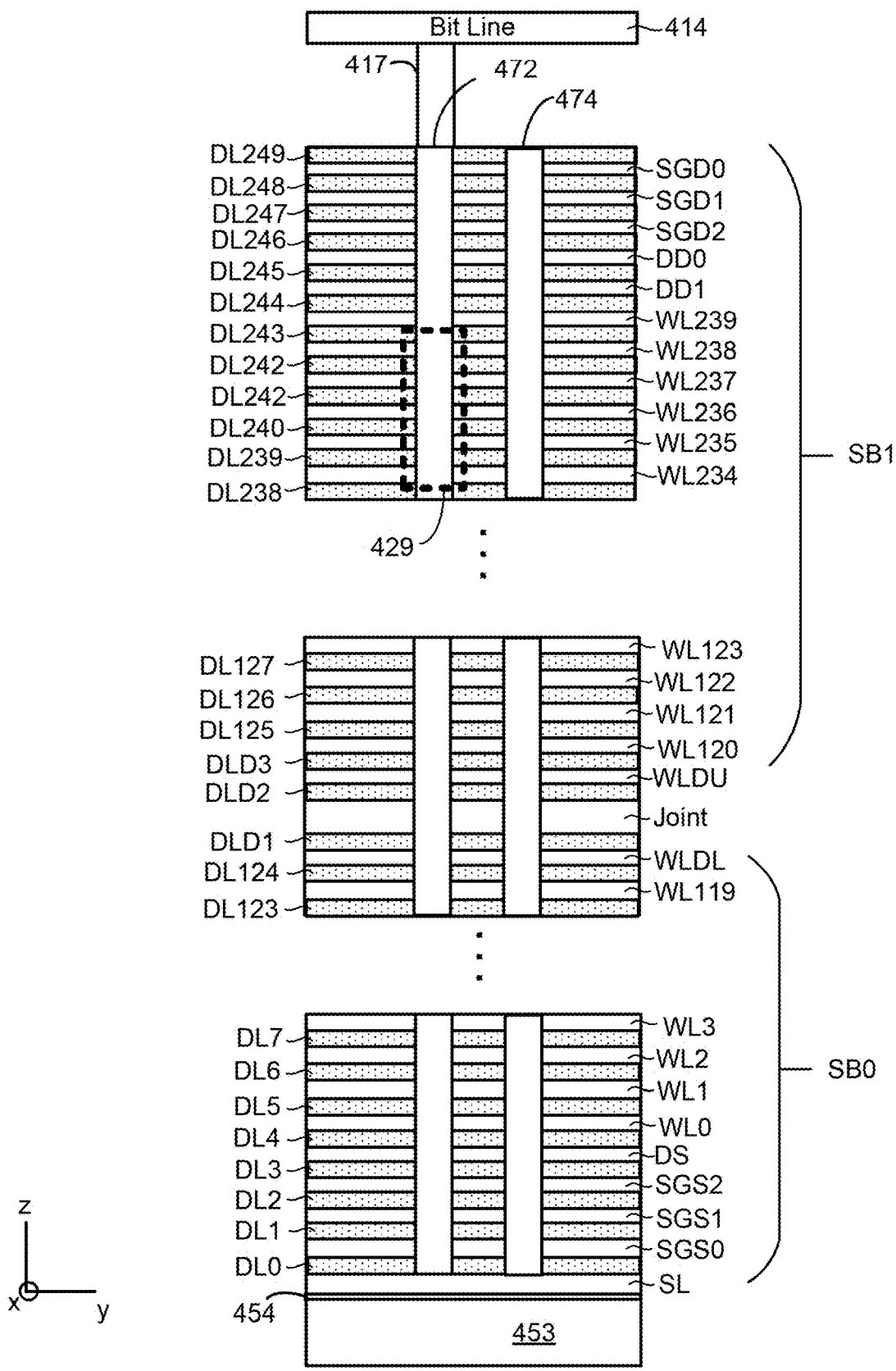
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2 (that form select lines); three source side select layers SGS0, SGS1, and SGS2 (that form select lines); three dummy word line layers DD0, DD1, and DDS; two hundred and forty word line layers WL0-WL239 for connecting to data memory cells, and dielectric layers DL0-DL249. Other embodiments can implement more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from SiO$_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host or entity outside of the storage system 100), such as data from a user of the host), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

FIG. 4C also shows a Joint area (Joint). In one embodiment it is expensive and/or challenging to etch so many word line layers intermixed with dielectric layers. To ease this burden, one embodiment includes laying down a first stack of word line layers alternating with dielectric layers, laying down the Joint area, and laying down a second stack of word line layers alternating with dielectric layers. The Joint area is positioned between the first stack and the second stack. The Joint area is used to connect to the first stack to the second stack. In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

In one embodiment, a block is divided into sub-blocks. For example, the first/lower stack of each vertical column is part of a lower sub-block SB0 and the second/upper stack is of each vertical column is part of an upper sub-block SB1.

Figure 4D:
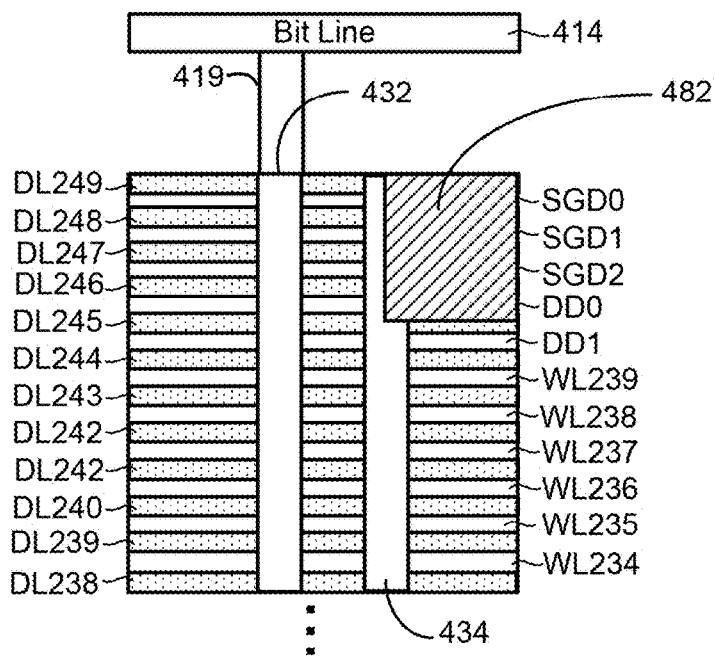
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows some of the same alternating conductive and dielectric layers as FIG. 4C. FIG. 4D also shows isolation region 482. Isolation regions 480, 482, 484, 486 and 488) occupy space that would have been used for a portion of the memory holes/vertical columns/NAND strings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with $SiO_2$.

Figure 4E:
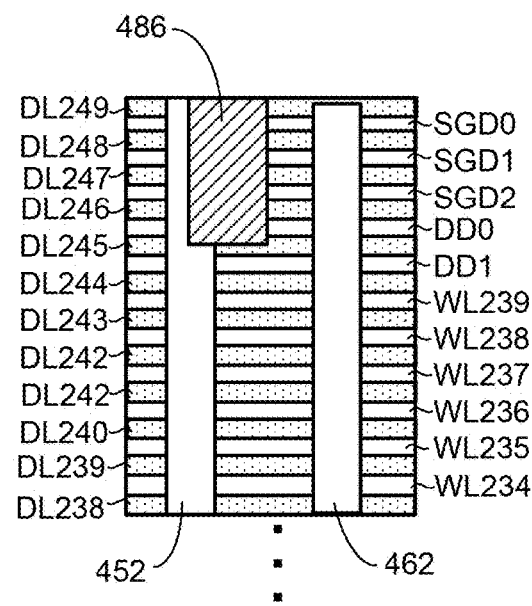
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 462 (see FIG. 4B). FIG. 4E shows the same alternating conductive and dielectric layers as FIG. 4C. FIG. 4E also shows isolation region 486 cutting into vertical columns (NAND string) 452.

Figure 4F:
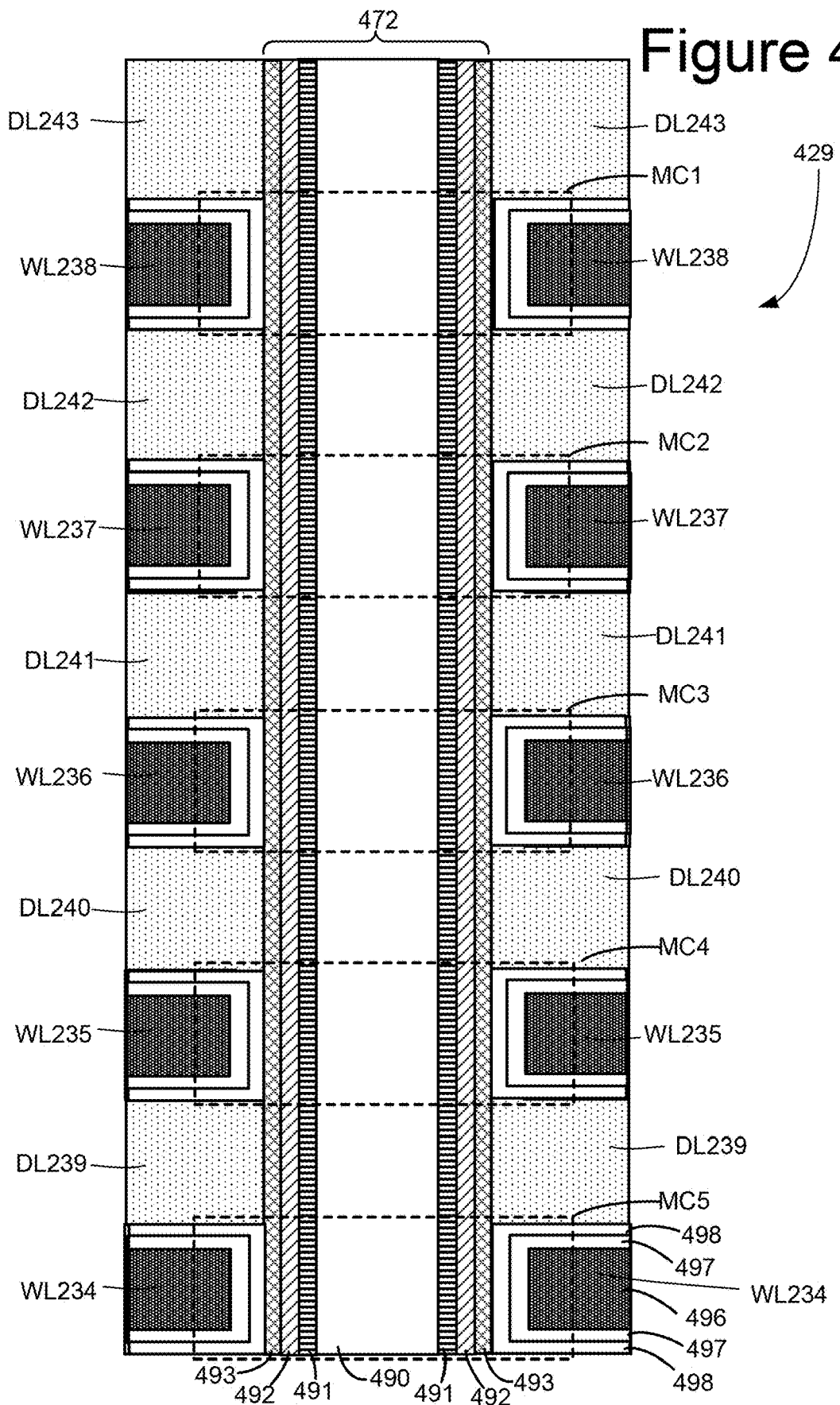
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DL239, DL240, DL241, DL242 and DLL43, as well as word line layers WL234, WL235, WL236, WL237, and WL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WL238 and a portion of vertical column 472 comprise a memory cell MC1. Word line layer WL237 and a portion of vertical column 472 comprise a memory cell MC2. Word line layer WL236 and a portion of vertical column 472 comprise a memory cell MC3. Word line layer WL235 and a portion of vertical column 472 comprise a memory cell MC4. Word line layer WL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
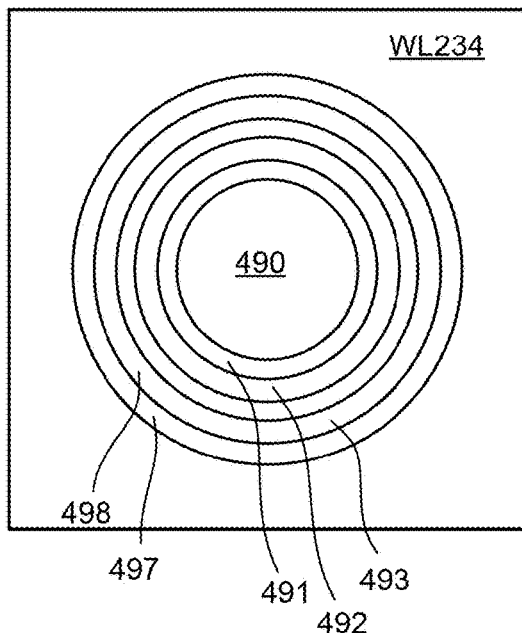
FIG. 4G depicts a cross section of as memory hole that implements a vertical NAND string.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498.

Figure 4H:
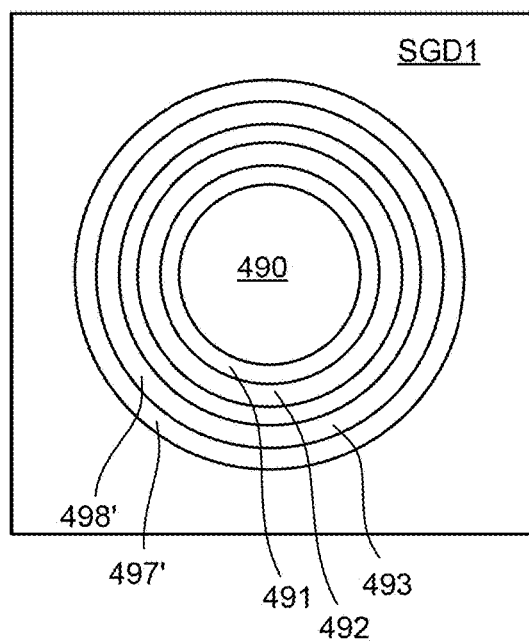
FIG. 4H depicts a cross section of as memory hole that implements a vertical NAND string.

FIG. 4H shows a cross section of vertical column 472 of FIG. 4F, cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
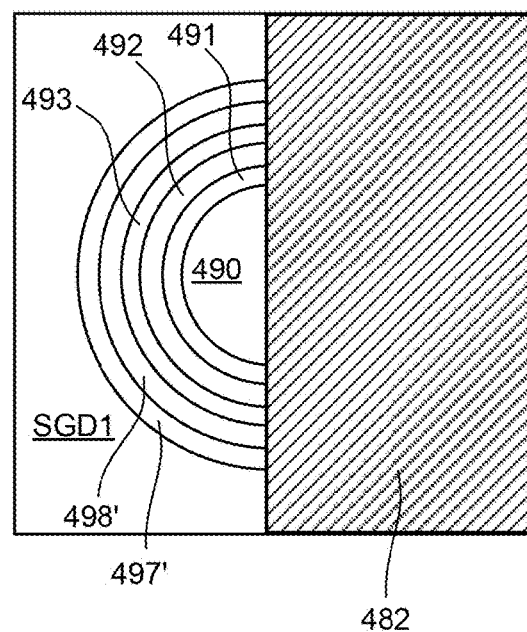
FIG. 4I depicts a cross section of as memory hole that implements a vertical NAND string.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer and select line layer) of vertical column 434 is semicircular in shape (or partially circular in shape) due to vertical column (NAND string) 434 intersecting isolation region 482.

Figure 4J:
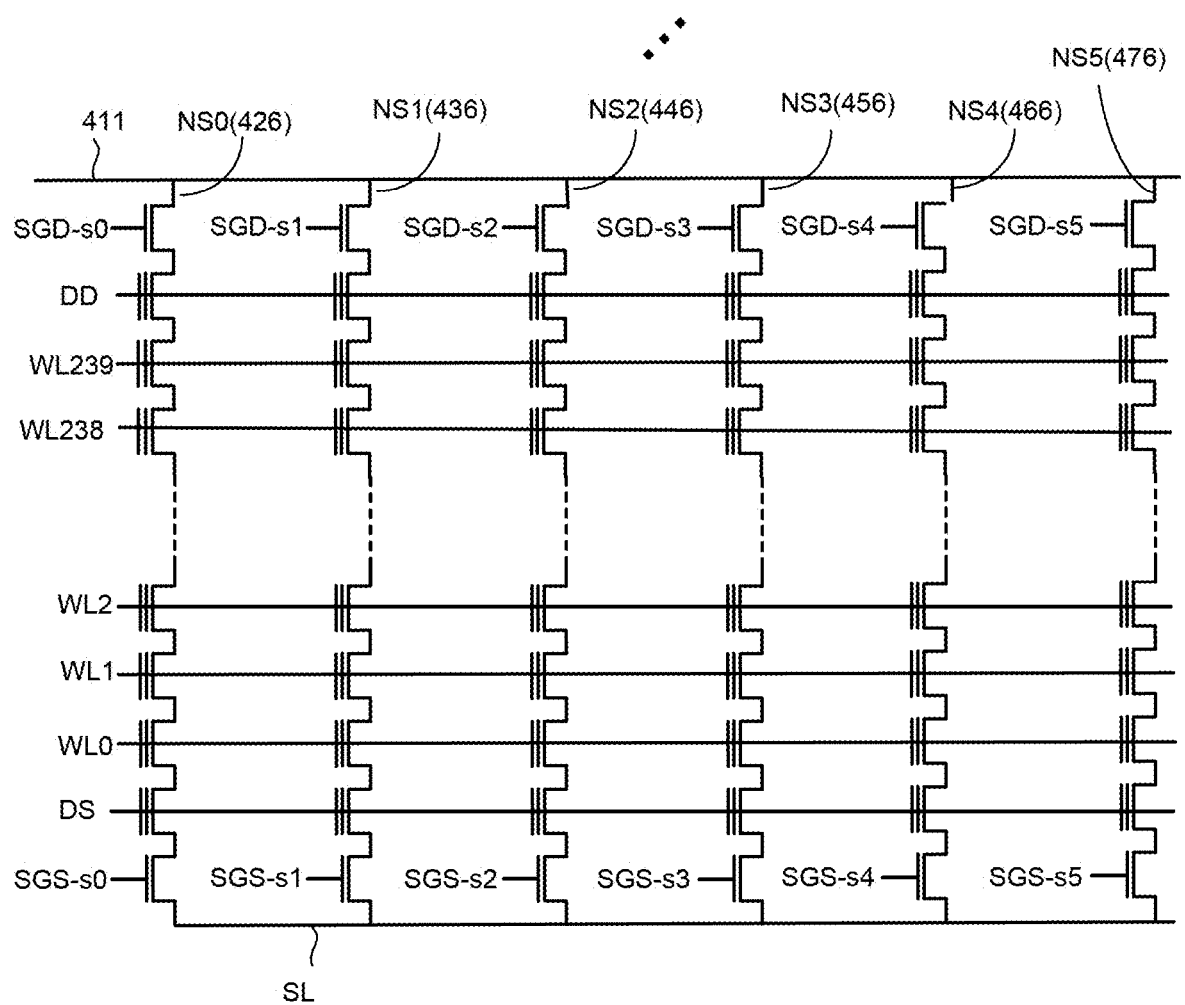
FIG. 4J is a schematic of a plurality of NAND strings.

FIG. 4J is a schematic diagram of a portion of the memory array 202 depicted in in FIGS. 4-4I. FIG. 4J shows physical data word lines WL0-WL239 running across the entire block. The structure of FIG. 4J corresponds to a portion 306 in Block 2 of Figure A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476).

As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5 in order to independently connect and disconnect the six sub-blocks from the bit lines. Thus, the drain side select gates for each sub-block can be controlled independently from drain side select gates for other sub-blocks of the block. Although the select gates SGD-s0, SGD-s1, SGD-s2, SGD-s3, SGD-s4, and SGD-s5 are isolated from each other due to the isolation regions, the data word lines WL0-WL239 of each sub-block are connected together such that the word lines connected to NAND strings of all sub-blocks of the block.

Similarly, in one embodiment, SGDS0, SGS1 and SGS2 are connected together to operate as a single logical select gate for each sub-block separated by isolation regions to form SGS-s0, SGS-s1, SGS-s2, SGS-s3, SGS-s4, and SGS-s5 in order to independently connect and disconnect the six sub-blocks from the source line SL. Thus, the source side select gates for each sub-block can be controlled independently from source side select gates for other sub-blocks of the block. In some embodiment, there can be more than one source line. The separate source side select lines SGD-s0, SGD-s1, SGD-s2, SGD-s3, SGD-s4, and SGD-s5 and the separate drain side select lines SGS-s0, SGS-s1, SGS-s2, SGS-s3, SGS-s4, and SGS-s5 allow one sub-block to be selected for a memory operation while the other sub-blocks are unselected, with NAND strings of the unselected sub-blocks being disconnected from the bit liens and one or more source lines (e.g., NAND strings of the unselected sub-blocks are floated).

The isolation regions (480, 482, 484, 486 and 486) are used to allow for separate control of the above-described regions. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

Although the example memories of FIGS. 4-4J are three dimensional memory structure that includes vertical NAND strings with charge-trapping material, other (2D and 3D) memory structures can also be used with the technology described herein.

Figure 5A:
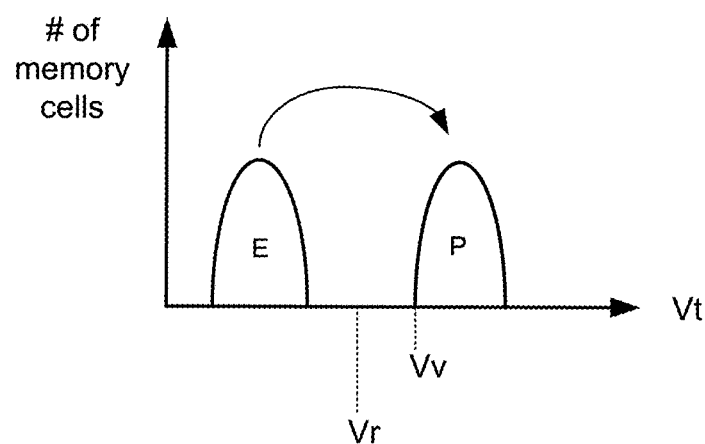
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read compare voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
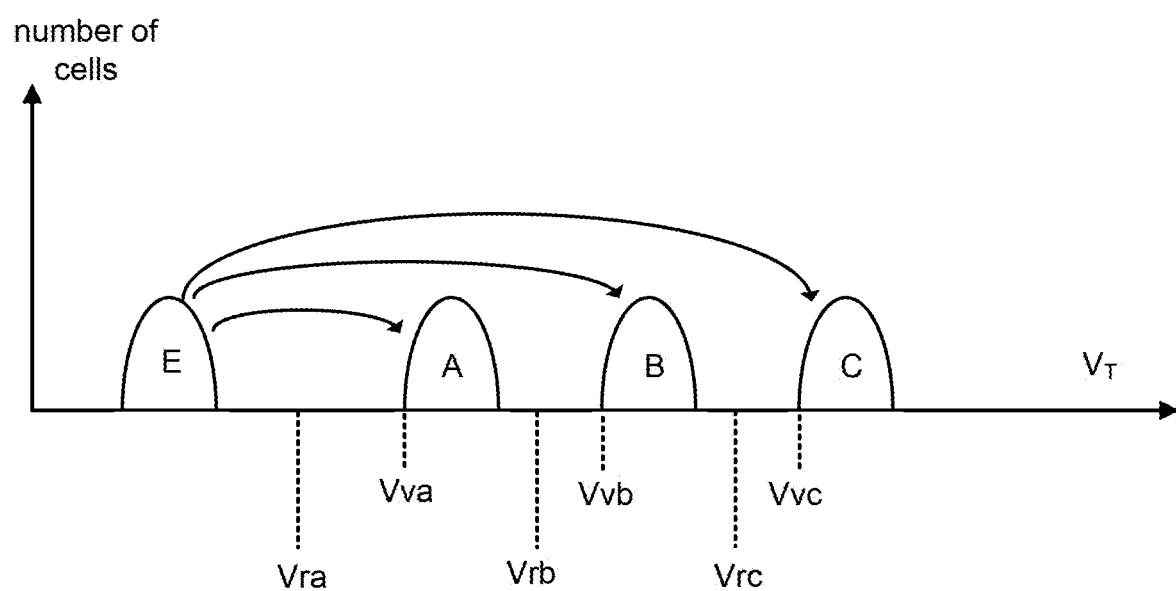
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read compare voltages, VrA, VrB, VrC, VrD, VrE, VrF, and VrG for reading data from memory cells. By testing (e.g., performing sense operations) whether the threshold voltage of a given memory cell is above or below the seven read compare voltages, the system can determine what data state (i.e., A, B, C, D, . . . ) a memory cell is in.

FIG. 5C also shows seven verify compare voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages VrA, VrB, VrC, VrD, VrE, VrF, and VrG, of FIG. 5C) or verify operation (e.g. see verify target voltages VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5E:
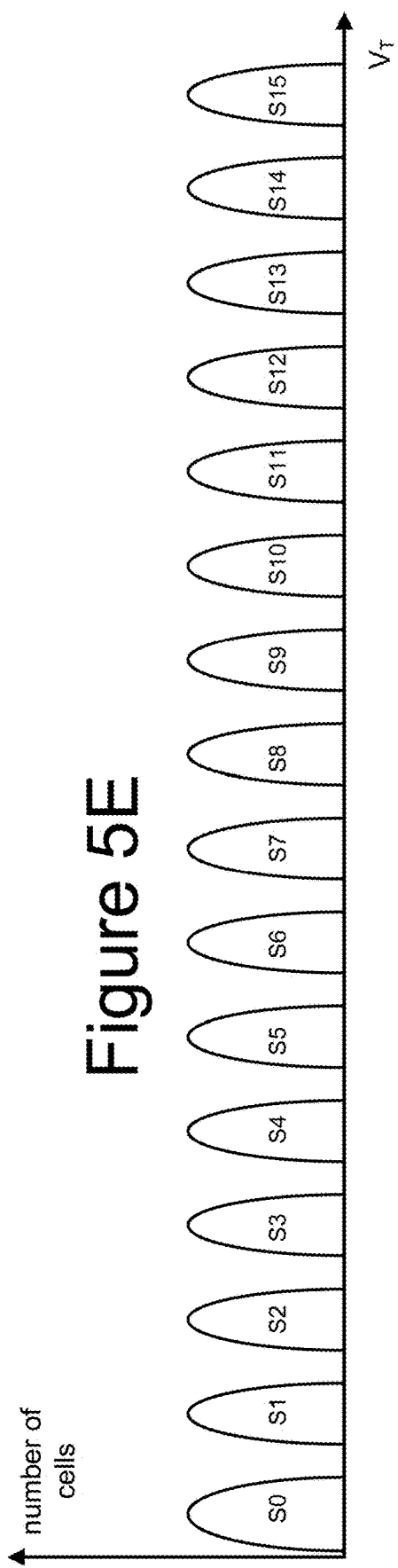
FIG. 5E depicts threshold voltage distributions.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read compare voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read compare voltages and verify compare voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|----|----|----|----|----|----|
| TP | 1  | 1  | 1  | 1  | 1  | 0  | 0  | 0  | 0  | 0  | 1  | 1  | 0  | 0  | 0  | 1  |
| UP | 1  | 1  | 0  | 0  | 0  | 0  | 0  | 0  | 1  | 1  | 1  | 1  | 1  | 1  | 0  | 0  |
| MP | 1  | 1  | 1  | 0  | 0  | 0  | 0  | 1  | 1  | 0  | 0  | 0  | 0  | 1  | 1  | 1  |
| LP | 1  | 0  | 0  | 0  | 1  | 1  | 0  | 0  | 0  | 0  | 0  | 1  | 1  | 1  | 1  | 1  |

Figure 5F:
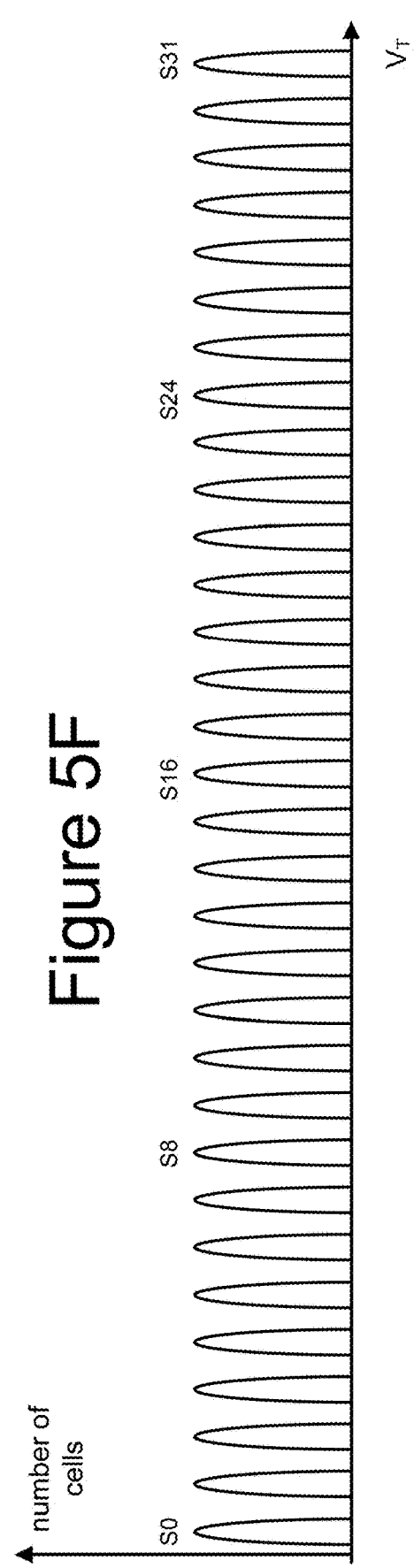
FIG. 5F depicts threshold voltage distributions.

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
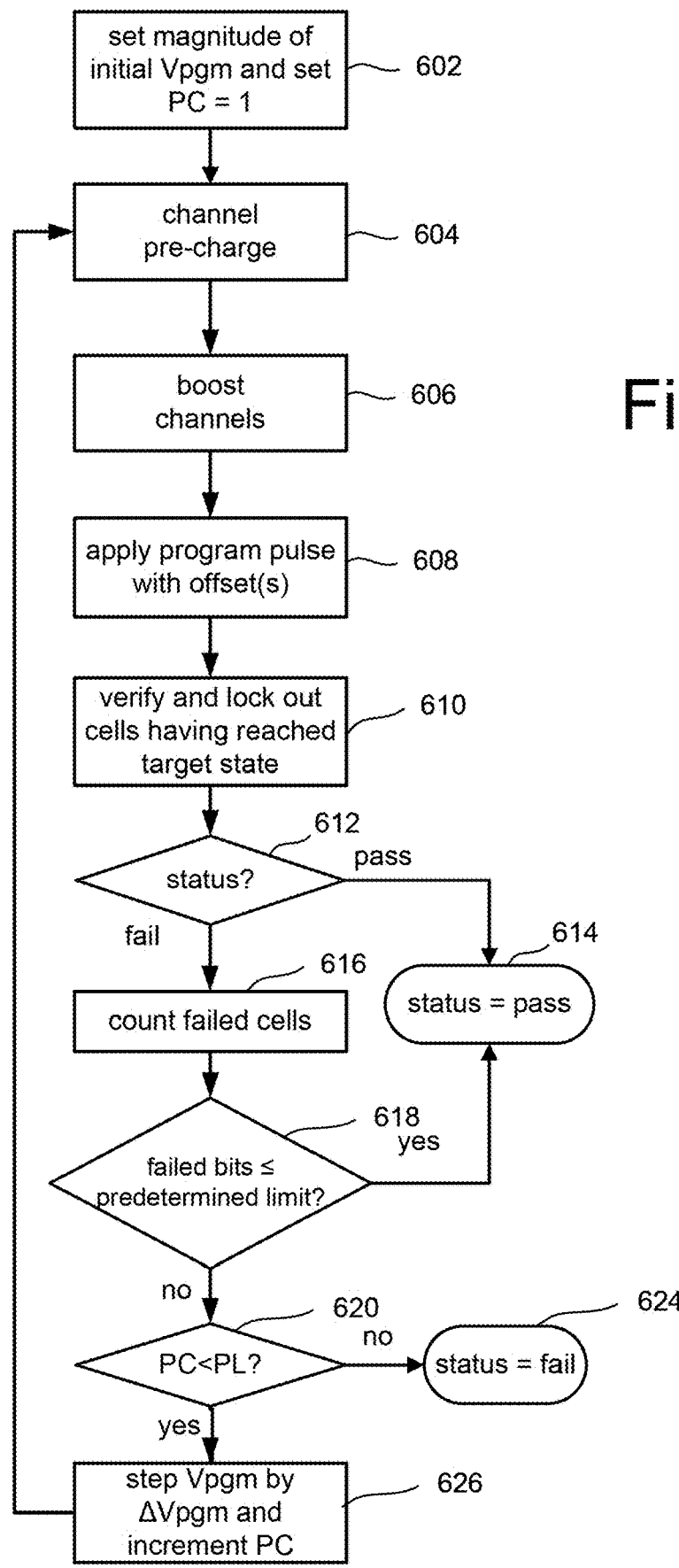
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-pass programming, which comprises programming processes that use multiple passes to complete programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string. In one embodiment, for example, the channel is pre-charged to ~2 volts in step 604 and then floated. In step 606, the channel is boosted up from the 2 volts to a boosting voltage of approximately 8-10 volts.

In step 608, a program voltage pulse of the programming voltage signal Vpgm is applied to the selected word line (the word line selected for programming). In some embodiments, the magnitude and/or pulse width of the program voltage pulse can be modified from the standard magnitude and/or pulse width by one or more offsets, as described below. If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify compare levels. In one embodiment, the verification process is performed by testing whether the threshold voltages of the memory cells selected for programming have reached the appropriate verify compare voltage. In one embodiment that corresponds to FIG. 5C, the process of FIG. 6 is concurrently performed for memory cells being programmed to data states A, B, C, D, E, F and G. In one embodiment, step 610 can include testing for each of data states A, B, C, D, E, F and G (e.g., testing to see whether memory cells have threshold voltages greater than VvA, VvB, VvC, VvD, VvE, VvF, and VvG). In another embodiment, the system only tests for a subset of data states A, B, C, D, E, F and G during each loop of steps 604-626 based on the current threshold voltages of the memory cells, in what is known as a smart verify process. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, then the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size $\Delta$Vpgm (e.g., a step size of 0.1-1.0 volts). After step 626, the process loops back to step 604 and another program pulse is applied to the selected word line (by the control die) so that another loop (steps 604-626) of the programming process of FIG. 6 is performed.

In some embodiments, memory cells are programmed in an order from the source side to the drain side. For example, first the process of FIG. 6 is performed to program memory cells connected to WL0, followed by using the process of FIG. 6 to program memory cells connected to WL1, followed by using the process of FIG. 6 to program memory cells connected to WL2, followed by using the process of FIG. 6 to program memory cells connected to WL3, . . . followed by using the process of FIG. 6 to program memory cells connected to WL239.

In another embodiment, memory cells are programmed in an order from the drain side to the source side. For example, first the process of FIG. 6 is performed to program memory cells connected to WL239, followed by using the process of FIG. 6 to program memory cells connected to WL238, followed by using the process of FIG. 6 to program memory cells connected to WL237, followed by using the process of FIG. 6 to program memory cells connected to WL236, . . . followed by using the process of FIG. 6 to program memory cells connected to WL1, followed by using the process of FIG. 6 to program memory cells connected to WL0.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7:
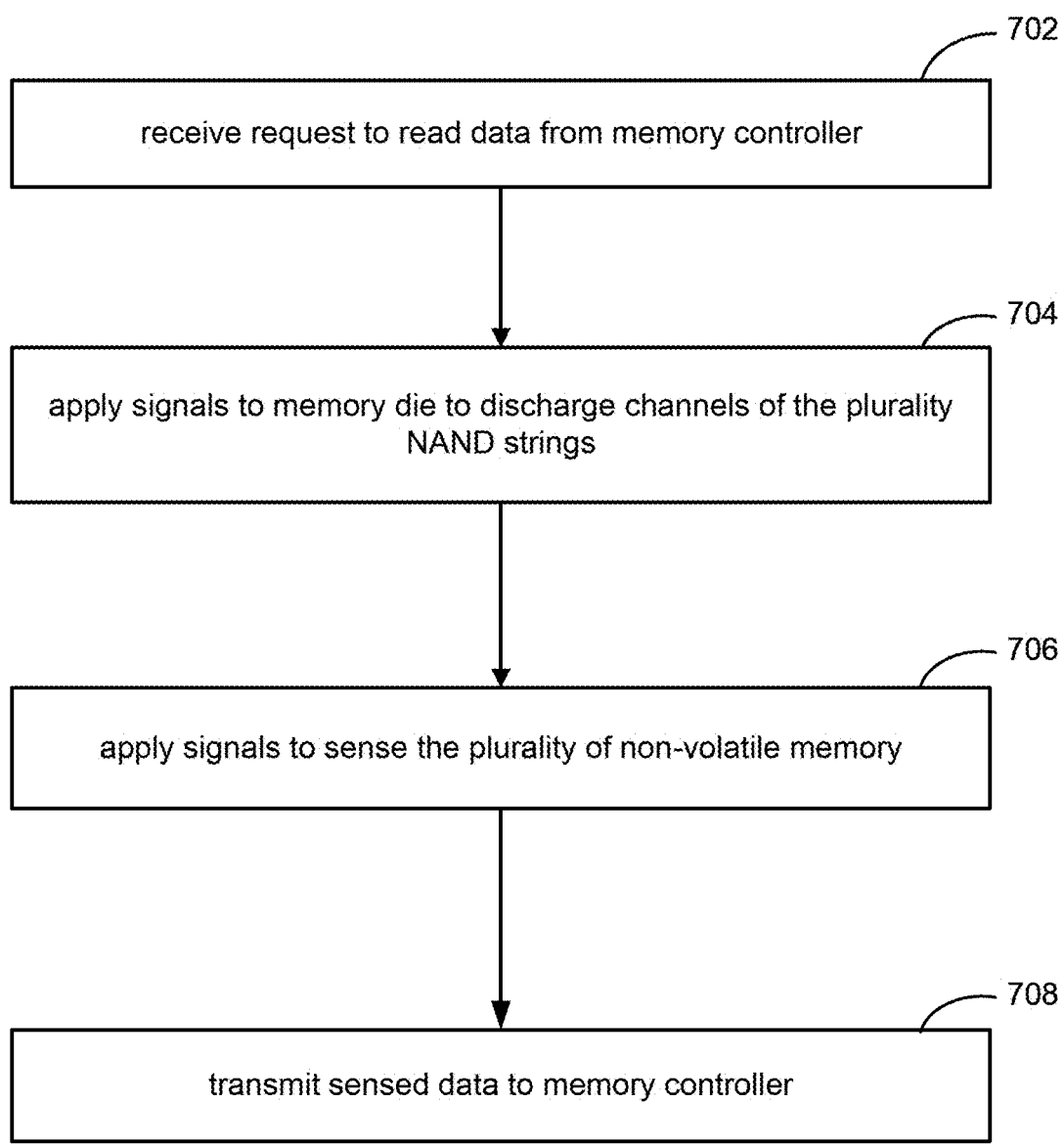
FIG. 7 is a flow chart describing one embodiment of a process for reading data.

FIG. 7 is a flow chart describing one embodiment of a process for reading data. For example, the process of FIG. 7 can be used to read data programmed according to the process of FIG. 6 (as well as other programming processes). In step 702, the control die 211 (embodiment of FIG. 2B) receives a request to read data from the memory controller 120. In step 704, the control die applies signals (e.g., bit line voltages, word line voltages, select gate voltages, source line voltages, etc.) to the memory die in order to discharge the channels of the NAND strings selected for reading. In one embodiment, a read process is used to read all memory cells (the selected memory cells) of one sub-block that are connected to a common word line. These selected memory cells are part of NAND strings (selected NAND strings) of a same sub-block. During step 704, the channels of the selected NAND strings are discharged so that they are at known condition. In step 706, the control die applies signals (e.g., bit line voltages, word line voltages, select gate voltages, source line voltages, etc.) to the memory die in order to sense the selected memory cells. One or more sensing operations can be performed to determined what data state (see e.g., FIGS. 5A-F) the selected memory cells are in. The sensed data is returned to memory controller 120 in step 708. In one embodiment, control die 211 transmits codewords (e.g. host data with ECC) to the memory controller 120 and memory controller 120 decodes the sensed data to determine the host data being stored. In another embodiment, control die 211 decodes the sensed data and transmits the decoded host data to memory controller 120, which then reports the data read to host 102. Another embodiment uses the structure of FIG. 2A to perform the process of FIG. 7.

Figure 8:
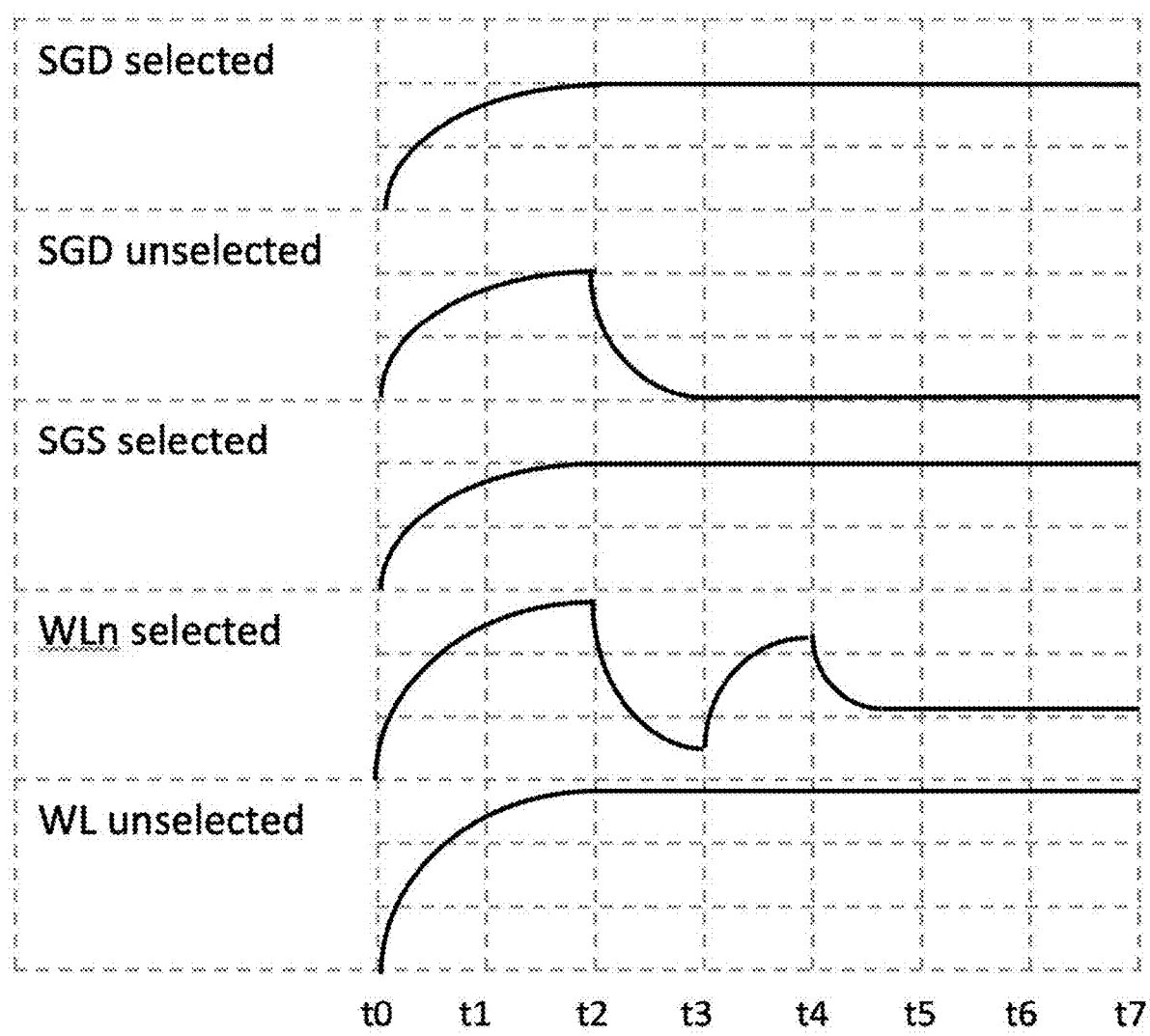
FIG. 8 is signal timing diagram for a read process.

FIG. 8 is signal timing diagram that describes the behavior of certain signals during one embodiment of a read process. For example, times t0-t3 of FIG. 8 correspond to discharging the channels of the selected NAND strings during step 704 of FIG. 7 and times t3-t7 corresponds to sensing the selected memory cells during step 706 of FIG. 7. FIG. 8 depicts the five signals: SGD selected, SGD unselected, SGS selected, WLn selected, and WL unselected. The signal SGD selected is the SGD select line for the selected sub-block (e.g., see SGD-s0, SGD-s1, SGD-s2, SGD-s3, SGD-s4, and SGD-s5 of FIG. 4J). SGD unselected are the SGD select lines for sub-blocks that are not the selected sub-block for the read operation. The signal SGS selected is the SGS select line for the selected sub-block (e.g., see SGS-s0, SGS-s1, SGS-s2, SGS-s3, SGS-s4, and SGS-s5 of FIG. 4J). The signal WLn selected refers to the selected word line (the word line connected to the memory cells selected to be read). The signal WL unselected are the word lines in the block other than the selected word line.

At time t0 of FIG. 8, SGD selected is raised to a voltage that turns on the drain side select gates for the selected sub-block (e.g., connects the NAND strings to the corresponding bit lines), SGD unselected is raised to a voltage that turns on the drain side select gates for the unselected sub-block, SGS selected is raised to a voltage that turns on the source side select gates for the selected sub-block (e.g., connects the NAND strings to the source line), WLn selected is raised to a pass gate voltage (e.g., a high enough gate voltage to have the memory cells conduct current regardless of which data state the memory cell is in), and WLunselected is raised to the pass gate voltage. That is, unselected word lines are raised to respective pass gate voltages (it is possible that the pass gate voltage varies a bit from word line to word line). During the period between t1 and t2, the NAND strings are connected to (and in communication with) the bit lines (e.g., at ground) and source line (e.g., at ground) to dissipate/clear out any charge in the channel. At time t2, SGD unselected is dropped to ground to cut off the unselected NAND strings from the bit lines. Also at time t2, the selected word line WLn selected is dropped to a recover voltage and then raised to a read compare voltage (e.g., VrA, VrB, VrC, VrD, VrE, VrF, and VrG of FIG. 5C) at time t3. However, rather than be raised directly to the read compare voltage, first the selected word line WLn selected is raised (e.g., a voltage spike) to a value higher than the read compare voltage by a predetermined percentage of the read compare voltage (e.g., 20% higher) in order to speed up the process of the read compare voltage propagating the length of the selected word line WLn. After the selected word line WLn selected settles at the read compare voltage, the selected memory cells are sensed. The bit line voltage (not depicted in FIG. 8) may be set to 0 V during the discharge period (t0-t3) to help discharge the voltage of the selected NAND string channels from the drain end of the NAND strings. At t4, the bit line voltage is increased to a sensing voltage (e.g., 0.25-0.8 v). During sensing, a sense node voltage of a sense amplifier may remain relatively steady or may decay. If the sense node voltage decays below a specified trip voltage, the selected memory cell is considered to be in a conductive state and the threshold voltage of the selected memory cell is below the read compare voltage. The determination of whether the sense node voltage decays below the trip voltage is made between t5 and t7.

In many prior memory systems, the unselected SGS lines will have the same voltage signal as the SGS selected. Thus, the SGS lines are used to connect the unselected NAND strings to the source line during the discharge period (t0-t3). Since the SGS lines are used to connect the unselected NAND strings to the source line during the discharge period (t0-t3), the unselected NAND strings of the unselected blocks are drawing current from the source line. However, these unselected NAND strings of the unselected blocks are not being read; therefore, any current they draw is wasted. As many non-volatile memory systems are used in mobile devices, there is a desire to use a little power as possible in order to extend battery life.

To prevent the unselected NAND strings of the unselected blocks from drawing current from the source line, it is proposed to independently operate the source side select lines SGS in order to turn off the unselected source side select gates of NAND strings of the unselected sub-blocks during the discharge period (t0-t3) so that the NAND strings of the unselected sub-blocks are cut off from the source line during the discharge period (t0-t3) and do not draw any current. This arrangement is depicted in FIG. 9.

Figure 9:
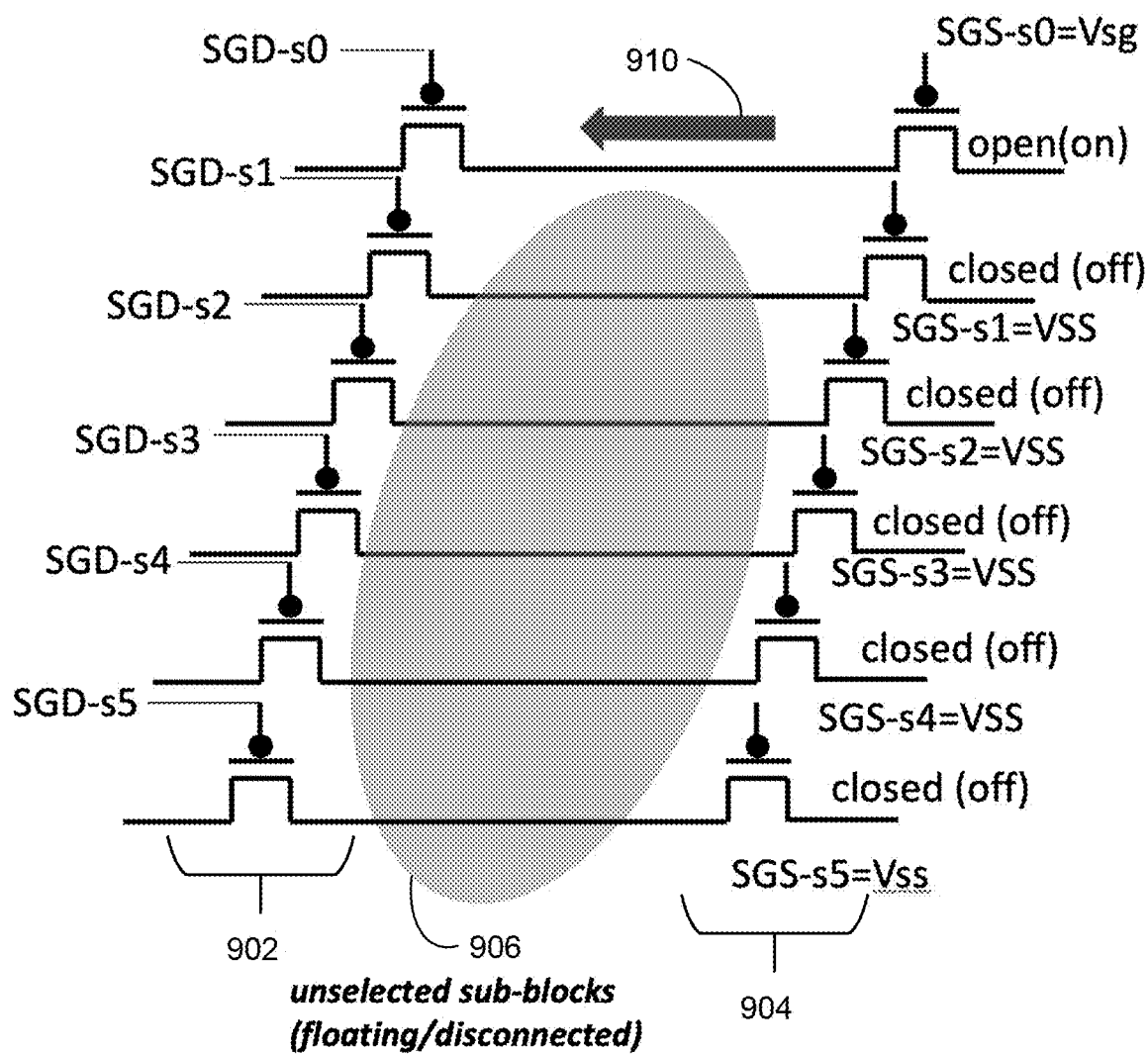
FIG. 9 depicts a set of select gates.

FIG. 9 shows six drain side select lines SGD-s0, SGD-s1, SGD-s2, SGD-s3, SGD-s4, and SGD-s5 (one for each of the six sub-blocks) connected to drain side select gates 902; and six source side select lines SGS-s0, SGS-s1, SGS-s2, SGS-s3, SGS-s4, and SGS-s5 (one for each of the six sub-blocks) connected to source side select gates 904. In the example depicted in FIG. 9, the first sub-block is selected for reading. The first sub-block corresponds to region 420 of FIG. 4B, SGD-50 and SGS-s0. The drain side select gates connected to SGD-s0 and the source side select gates connected to SGS-s0 are all turned on (e.g., open) in response SGD-s0 and SGS-s0 applying a voltage Vsg of approximately 4v from time t2 of FIG. 8 so that they connect the selected NAND string to the bit lines and the source line and allow current to flow in the channel of the NAND strings, as depicted by arrow 910.

The drain side select gates 902 connected to SGD-s1, SGD-s2, SGD-s3, SGD-s4, and SGD-s5 and the source side select gates 904 connected to SGS-s1, SGS-s2, SGS-s3, SGS-s4, and SGS-s5 are all turned off (e.g., closed) in response SGD-s1, SGD-s2, SGD-s3, SGD-s4, SGD-s5, SGS-s1, SGS-s2, SGS-s3, SGS-s4, and SGS-s5 applying a voltage of approximately 0 v so that they disconnect the unselected NAND strings from the bit lines and the source line, do not allow current to flow in the channel of the unselected NAND strings, and cause the unselected NAND strings of the unselected sub-blocks 906 (see regions 430, 440, 450, 460 and 470 of FIG. 4B) to be floating.

FIG. 8 shows the unselected drain side select lines (SGD unselected) first being raised to an initial positive voltage in a voltage spike from t0-t2 to dissipate the channels of NAND strings in unselected sub-blocks and prevent any unwanted boosting of those channels. In some embodiments, the unselected source side select lines would have the same voltage signal as the unselected drain side select lines (SGD unselected), including the voltage spike from t0-t2 to dissipate the channels of NAND strings in unselected sub-blocks and prevent any unwanted boosting of those channels. However, if that voltage spike is too long, then the NAND strings in unselected sub-blocks would draw too much current and negate the benefit of having independently controlled source side select gates. On the other hand, if the voltage spike is too short, the channels of the NAND strings in unselected sub-blocks may start to boost up in voltage in response to the word lines being raised to Vread from t0-t2 of FIG. 8. One problem with boosting the channels of the NAND strings in unselected sub-blocks is that when the selected word line is lowered to the recover voltage at time t3, the NAND strings in unselected sub-blocks will have a high potential difference between the selected word line and neighboring word lines may induce Hot Carrier Injections ("HCI"), as depicted in FIG. 10.

Figure 10:
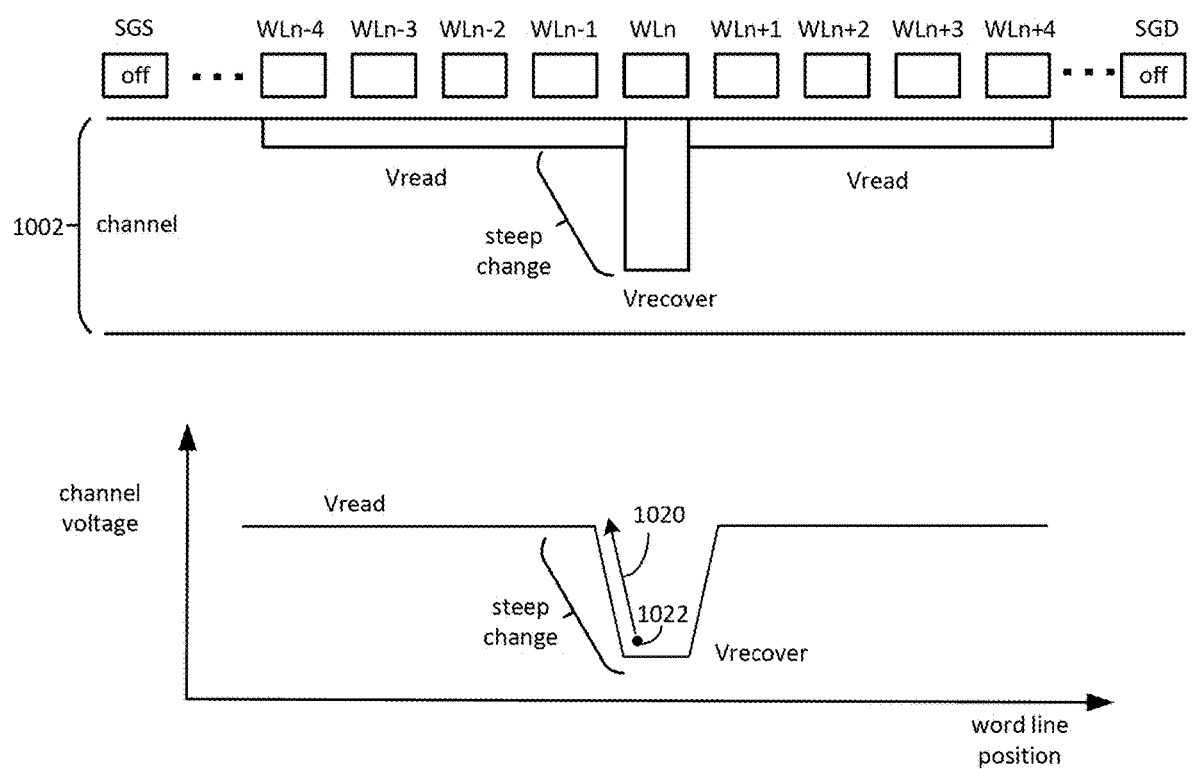
FIG. 10 depicts channel voltage for a NAND string during a read process.

FIG. 10 depicts channel voltage for a NAND string during the read process of FIG. 8, when the voltage spike on unselected drain side select lines (SGD unselected) and unselected source lines is too short (or non-existent). Specifically, FIG. 10 shows a cross section of select lines (SGS, SGD) and word lines ( . . . , WLn−4, WLn−3, WLn−2, WLn−1, WLn, WLn+1, WLn+2, WLn+3, WLn+4, . . . ) above a channel 1002 at time t3 of FIG. 8 when the voltage spike (at t0-t2) on unselected drain side select lines (SGD unselected) and unselected source lines is too short (or non-existent). The channel below unselected word lines (WLn−4, WLn−3, WLn−2, WLn−1, WLn+1, WLn+2, WLn+3, WLn+4) nearby the selected word line (WLn) is at Vread (e.g., ~6 v), while the channel below the selected word line (WLn) is at Vrecover (e.g., ~1 volts). Therefore, there is a steep change in voltage in the channel between the selected word line (WLn) and its adjacent neighbor word lines (WLn+1 and WLn−1), which will induce HCI as depicted by arrow 1020 representing injection of carrier 1022 into the charge trapping layer and causing a change in threshold voltage of one or more memory cells of the NAND string. A change in threshold voltage of one or more memory cells could lead to a change in the data state of the memory cells, which would result in an unwanted change (i.e., an error) in the data stored by the memory cells. This phenomenon is an example of a Read Disturb.

As discussed above, when the voltage spike (at t0-t2) on unselected drain side select lines (SGD unselected) and unselected source side select lines is too short (or non-existent) the unselected NAND strings can experience Read Disturb and when the voltage spike is too long unnecessary current can be drawn (and power wasted). To remedy this issue, it is proposed to remove the voltage spike on unselected drain side select lines (SGD unselected) and unselected source side select lines to prevent unnecessary current being drawn and power being wasted, and also adjusting the voltage applied to unselected word lines nearby the selected word line in order to create a channel potential gradient in NAND strings of unselected sub-blocks that includes a slower increase in voltage from below the selected word line outward than depicted in FIG. 10 in order to avoid Read Disturb. By removing the voltage spike on unselected drain side select lines (SGD unselected) and unselected source side select lines (e.g., maintaining the unselected drain side select lines and unselected source side select lines at ground), as depicted in FIG. 9, the NAND strings in unselected blocks will be floated during the read process as the drain side select gates and source side select gates of the NAND strings in unselected blocks will be closed thereby disconnecting the NAND strings in unselected blocks from respective bit lines and the source line. Note that in some embodiments, there can be more than source line (e.g., each sub-block having its own source line).

Figure 11:
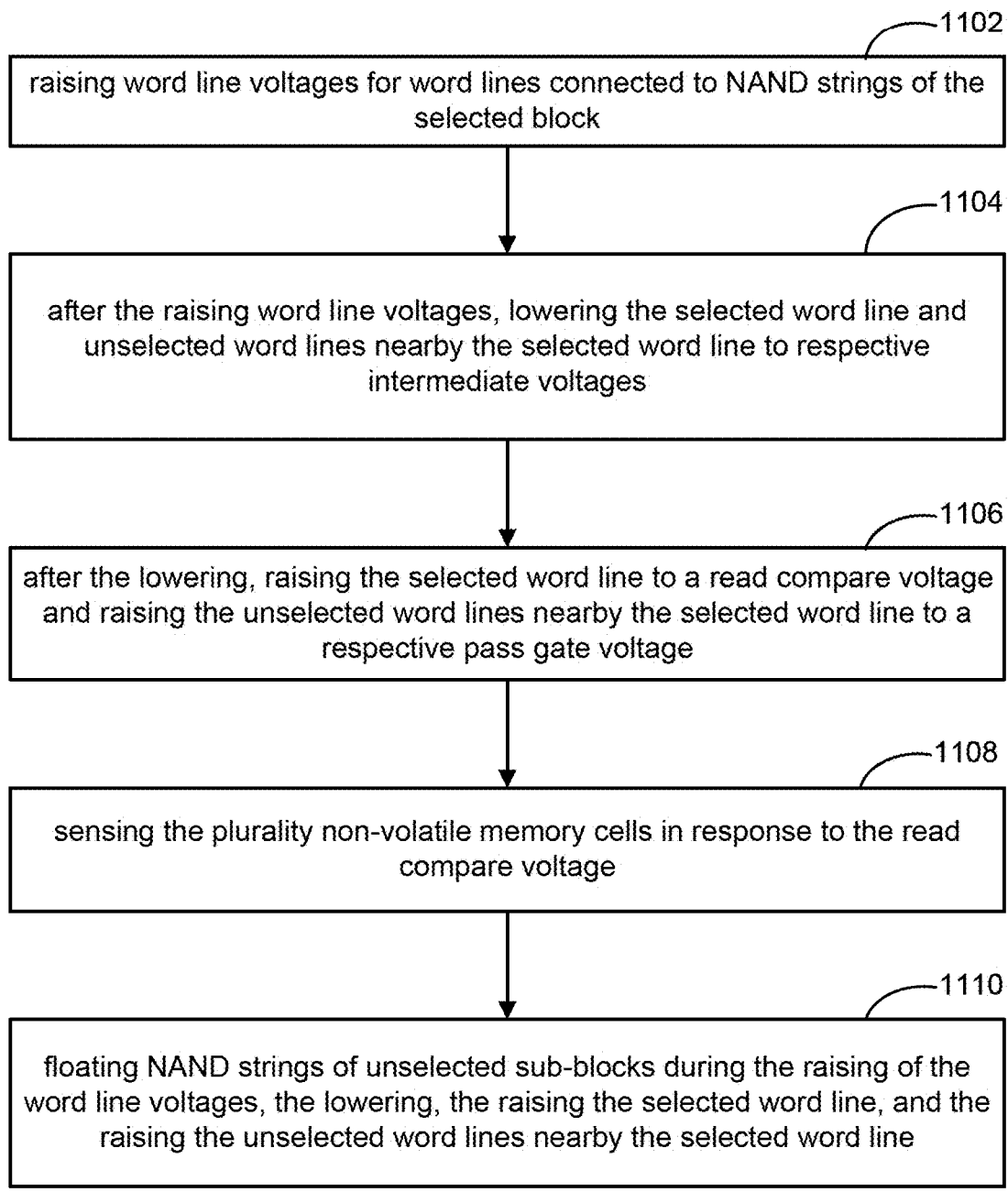
FIG. 11 is a flow chart describing one embodiment of a process for reading data.

FIG. 11 is a flow chart describing one embodiment of a process for reading data in accordance with the proposal to remove the voltage spike on unselected drain side select lines and unselected source side select lines to prevent unnecessary current being drawn and adjusting the voltage applied to unselected word lines nearby the selected word line in order to create a channel potential gradient in NAND strings of unselected sub-blocks that avoids Read Disturb. The process of FIG. 11 is an example implementation of steps 704 and 706 of FIG. 7. The process of FIG. 11 can be performed by any one of the one or more control circuits discussed above connected to one or more memory arrays (or other memory structures) as discussed above. For example, the process of FIG. 11 can be performed by the one or more control circuits discussed above on memory die 200 (see FIG. 2A) or on integrated memory assembly 207 (see FIG. 2B). In one example, the process of FIG. 11 is performed by or at the direction of state machine 262, using other components of System Control Logic 260, Column Control Circuitry 210 and Row Control Circuitry 220. The process of FIG. 11 can be performed by any one of the control circuits discussed above connected to a block of non-volatile memory cells arranged as NAND strings, where the block includes multiple sub-blocks and a plurality of word lines connected to NAND strings of all sub-blocks of the block, and the control circuit is configured to read data from a plurality non-volatile memory cells connected to a selected word line and on a plurality NAND strings of a selected sub-block.

Step 1102 of FIG. 11 includes raising word line voltages for word lines connected to NAND strings of the selected block. In one embodiment, these word lines are connected to all NAND strings of all sub-blocks of the selected block; therefore, the word line voltages applied in step 1102 will be received at the control gates of all NAND strings of all sub-blocks of the selected block. In one embodiment, all word lines for the selected bock are raised to the pass gate voltage Vread. In step 1104, after the raising of the word line voltages in step 1102, the control circuit lowers the voltages of the selected word line and unselected word lines nearby the selected word line to respective intermediate voltages. In one embodiment, each of the selected word line and unselected word lines nearby the selected word line will be lowered to a different intermediate voltage, while in other embodiments some of those word lines will have the same intermediate voltage. More details of step 1104 will be provided below. In step 1106, after the lowering of the voltages of the selected word line and unselected word lines nearby the selected word line to respective intermediate voltages as per step 1104, the control circuit raises the selected word line to a read compare voltage (e.g., see read compare voltages VrA, VrB, VrC, VrD, VrE, VrF, and VrG, of FIG. 5C) and raises the unselected word lines nearby the selected word line to respective pass gate voltages (the unselected word lines can all be raised to the exact same pass gate voltage or variations of the pass gate voltage). A pass gate voltage causes the memory cell to turn on and conduct current regardless of which data state the memory cell is currently programmed to. In step 1108, the control circuit senses the plurality non-volatile memory cells in response to the read compare voltage. In step 1110, the control circuit floats NAND strings of unselected sub-blocks. Step 1110 can be performed concurrently with steps 1102-1108 so that the NAND strings of unselected sub-blocks are floated during the raising of the word line voltages (step 1102), the lowering of the voltages of the selected word line and unselected word lines nearby the selected word line to respective intermediate voltages (step 1104), the raising of the selected word line and the unselected word lines nearby the selected word line (step 1106) and the sensing (step 1110).

By floating the NAND strings of unselected sub-blocks, those NAND strings will not draw any current and power is saved. As will be discussed in more detail below, by lowering the unselected word lines nearby the selected word line to respective intermediate voltages, a channel potential gradient in NAND strings of unselected sub-blocks is engineered that avoids Read Disturb. The combination of the floating of NAND strings of unselected sub-blocks and the lowering of voltages of the unselected word lines nearby the selected word line together avoid any long voltage spikes on the unselected select lines, which avoids slowing down the read process.

Figure 12:
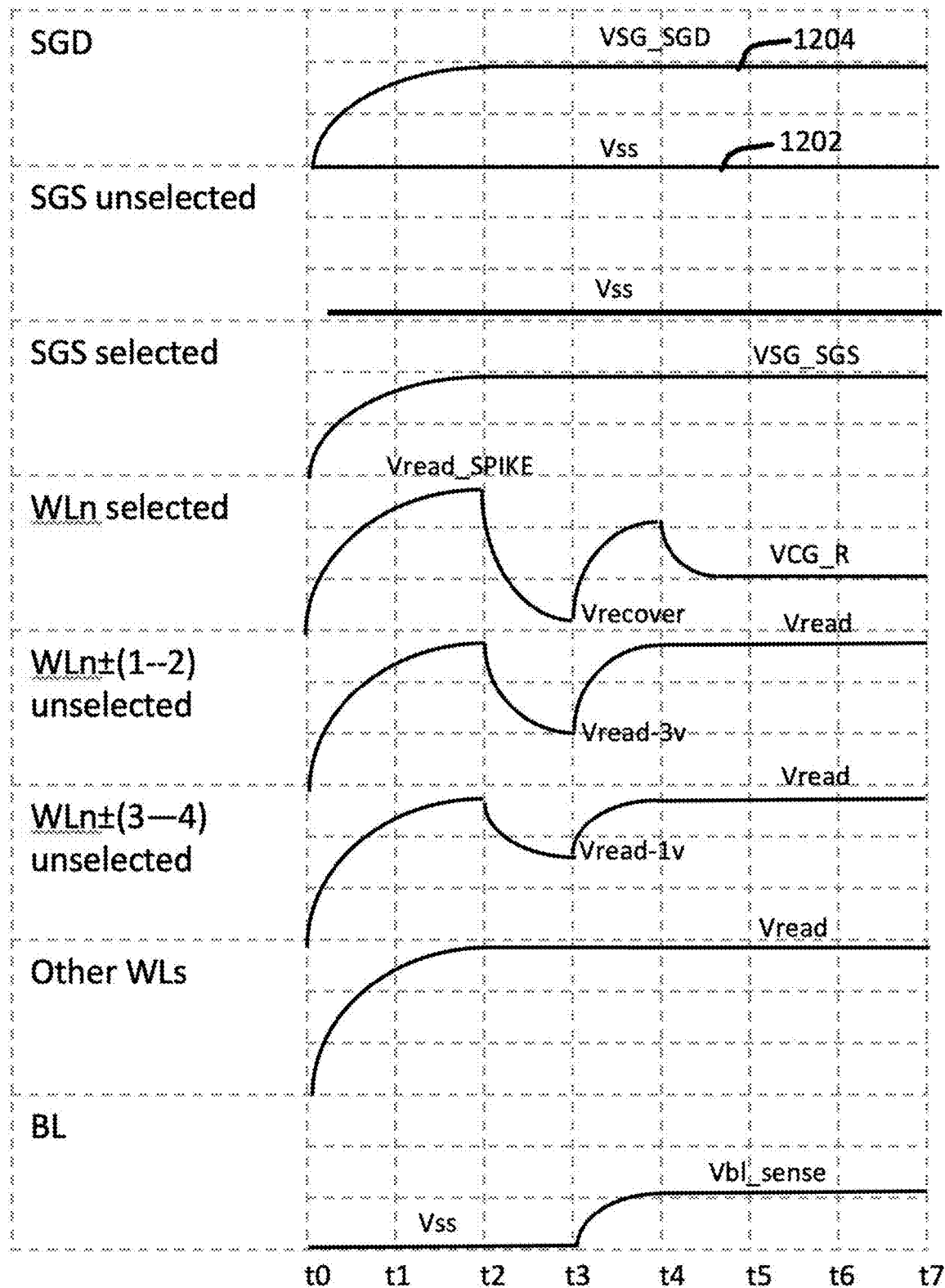
FIG. 12 is signal timing diagram for a read process.

FIG. 12 is signal timing diagram that describes the behavior of certain signals during a process for reading data in accordance with the proposal to remove the voltage spike on unselected drain side select lines and unselected source lines to prevent unnecessary current being drawn and adjust the voltage applied to unselected word lines nearby the selected word line in order to create a channel potential gradient in NAND strings of unselected sub-blocks that avoids Read Disturb. The process depicted in FIG. 12 is one example implementation of (one embodiment of) the process of FIG. 11.

FIG. 12 depicts the eight signals: SGD, SGS unselected. SGS selected, WLn selected, WLn+/−(1-2) unselected, WLn+/−(3-4) unselected, Other WLs and BL. The signals "SGD" shows two curves: curve 1202 represents the voltage applied to the drain side select gates (i.e. applied to the drain side select lines) for unselected sub-blocks and curve 1204 represents the voltage applied to the drain side select gates (i.e. applied to the source side select lines) for the selected sub-block. The signal "SGS unselected" is the gate voltage applied to the source side select gates (i.e. applied to the source side select lines) for unselected sub-blocks. The signal "SGS selected" is the gate voltage applied to the source side select gates (i.e. applied to the source side select lines) for the selected sub-block. The signal "WLn selected" is the voltage applied to the selected word line. The signal "WLn+/−(1-2) unselected" is the voltage applied to the following four unselected word lines nearby the selected word line: WLn−2, WLn−1, WLn+1 and WLn+2. The signal "WLn+/−(3-4) unselected" is the voltage applied to the following four unselected word lines nearby the selected word line: WLn−4, WLn−3, WLn+3 and WLn+4. In other embodiments, more or less word lines can be classified as unselected word lines nearby the selected word line, and there can be more than two groups. The signal "Other WLs" are the unselected word lines other than the unselected word lines nearby the selected word line (e.g., word lines other than WLn−4, WLn−3, WLn−2, WLn−1, WLn+1 WLn+2, WLn−3, WLn+3 and WLn+4). The signal "BL" is the voltage applied to selected bit line. Note that unselected bit lines remain at 0 volts during the time period displayed in FIG. 12. In some embodiments, the unselected word lines nearby the selected word line can include more or less than four word lines on each side of the selected weord line.

At time t0 of FIG. 12, all of the word lines are raised to Vread (e.g., ~6 volts), which is one example of a pass gate voltage. For example, FIG. 12 shows WLn selected, WLn+/−(1-2) unselected, WLn+/−(3-4) unselected, and Other WLs all being raised to Vread from time t0 to t2, corresponding to step 1102 of FIG. 11. For WLn selected, WLn+/−(1-2) unselected, and WLn+/−(3-4) unselected, the raising of the voltage to Vread comprises applying a voltage spike (e.g., Vread SPIKE). After reaching the peak voltage of the voltage spike (e.g., Vread), the voltages are lowered to respective intermediate voltages, corresponding to step 1104 of FIG. 11. In the embodiment of FIG. 12, WLn selected, WLn+/−(1-2) unselected, and WLn+/−(3-4) unselected are lowered to different intermediate voltages from time t2 to time t3. For example, WLn selected is lowered to Vrecover (e.g., 1 volt), WLn+/−(1-2) unselected are lowered to Vread−3 v, and WLn+/−(3-4) unselected are lowered to Vread−1 v. This staggered set of intermediate voltages for the unselected word lines nearby the selected word line create a gradual channel potential gradient in NAND strings of unselected sub-blocks that avoids Read Disturb.

At time t3, the voltage on WLn selected is raised to the appropriate read compare voltage. However, as discussed above, rather than be raised directly to the read compare voltage, the selected word line WLn is first raised (e.g., voltage spike) to a value higher than the read compare voltage by a predetermined percentage of the read compare voltage (e.g., 20% higher) in order to speed up the process of the read compare voltage propagating the length of the word line and then the selected word line WLn is allowed to settle at the read compare voltage (e.g., by t5). Also at time t3, the unselected word lines nearby the selected word line "(WLn+/−(1-2) unselected" and "WLn+/−(3-4) unselected" are raised back to Vread. The time period between t3 and t5 corresponds to step 1105 of FIG. 11. By time t5, the word line voltages have settled; therefore, after time t5 the data is sensed (corresponding to step 1108).

The bit line voltage BL may be set to 0 V during the discharge period (t0-t3) to help discharge the voltage of the selected NAND string channels from the drain end of the NAND strings. At t3, Vbl is increased to a sensing voltage (e.g., 0.25-0.8 v). During sensing, a sense node voltage of a sense amplifier may remain relatively steady or may decay. If the sense node voltage decays below a specified trip voltage, the selected memory cell is considered to be in a conductive state and the threshold voltage of the selected memory cell is below the read compare voltage. The determination of whether the sense node voltage decays below the trip voltage is made between t5 and t7.

To enable the conditions for sensing, the source side select lines and drain side select lines for selected NAND strings in the selected sub-block are raised to high enough voltages to turn on the connected select gates. For example, at time t1 SGD for selected NAND strings (see curve 1204) in the selected sub-block is raised VSG SGD (e.g., ~4 v) and SGS for selected NAND strings in the selected sub-block (SGS selected) is raised VSG SGS (e.g., ~4 v). NAND strings in unselected sub-blocks are floated (step 1110 of FIG. 11) by keeping the SGS lines and SGD lines for unselected sub-blocks at Vss (e.g., 0 volts or ground) during the entire period depicted in FIG. 12. In some embodiments, the memory system may need to sense at multiple read compare voltages in order to determine which data state the memory cells resides in, which may include performing the process depicted in FIG. 12 multiple times (e.g., once for each data state). Note that times t0-t3 correspond to the discharge period and times t3-t7 correspond to the sensing period.

Figure 13:
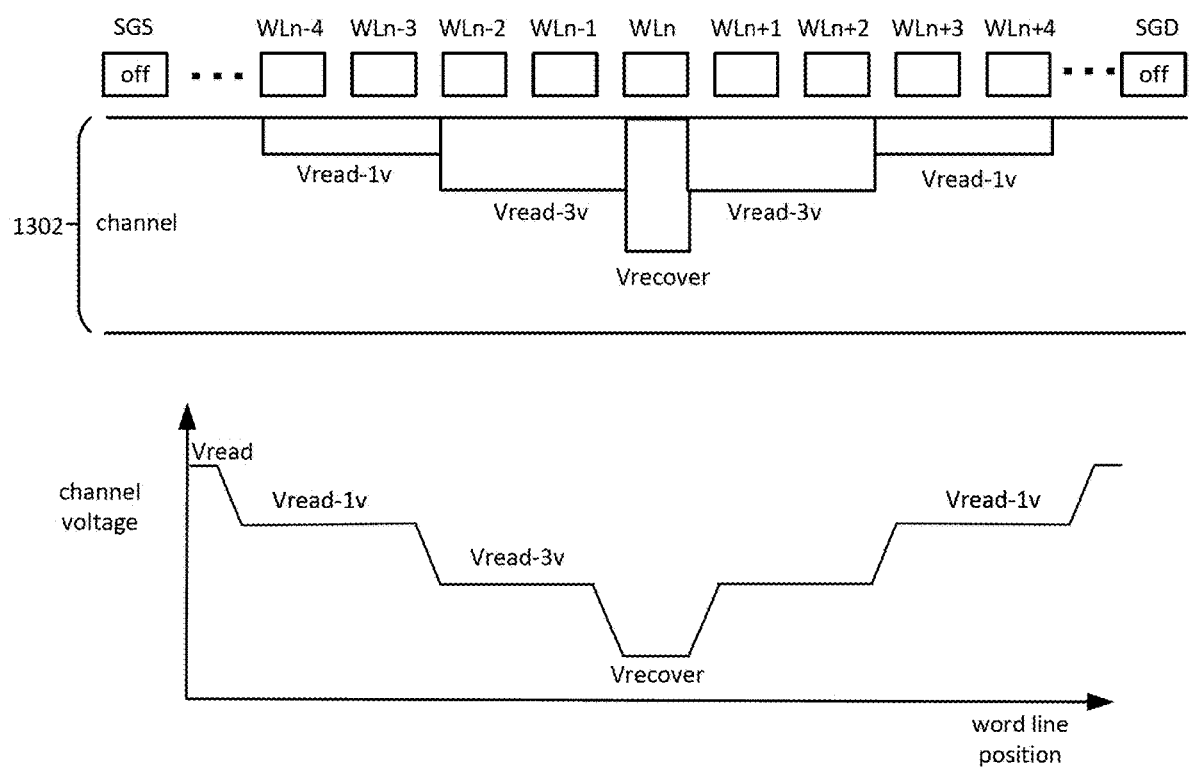
FIG. 13 depicts channel voltage for a NAND string during a read process.

FIG. 13 depicts the channel voltage for a NAND string of an unselected block at time t3 of FIG. 12. Specifically, FIG. 13 shows a cross section of select lines (SGS, SGD) and word lines ( . . . , WLn−4, WLn−3, WLn−2, WLn−1, WLn, WLn+1, WLn+2, WLn+3, WLn+4, . . . ) above a channel 1302 at time t3 of FIG. 12. The channel below unselected word lines WLn−4, WLn−3, WLn+3, and WLn+4 is at Vread−1 v. The channel below unselected word lines WLn−2, WLn−1, WLn+1, and WLn+2 is at Vread−3 v. The channel below the selected word line (WLn) is at Vrecover. As can be seen from FIG. 13, there is a more gradual change in voltage in the channel between the selected word line (WLn) and its adjacent neighbor word lines as compared to the embodiment of FIG. 10; therefore, HCI should not occur and Read Disturb will be avoided.

Figure 14:
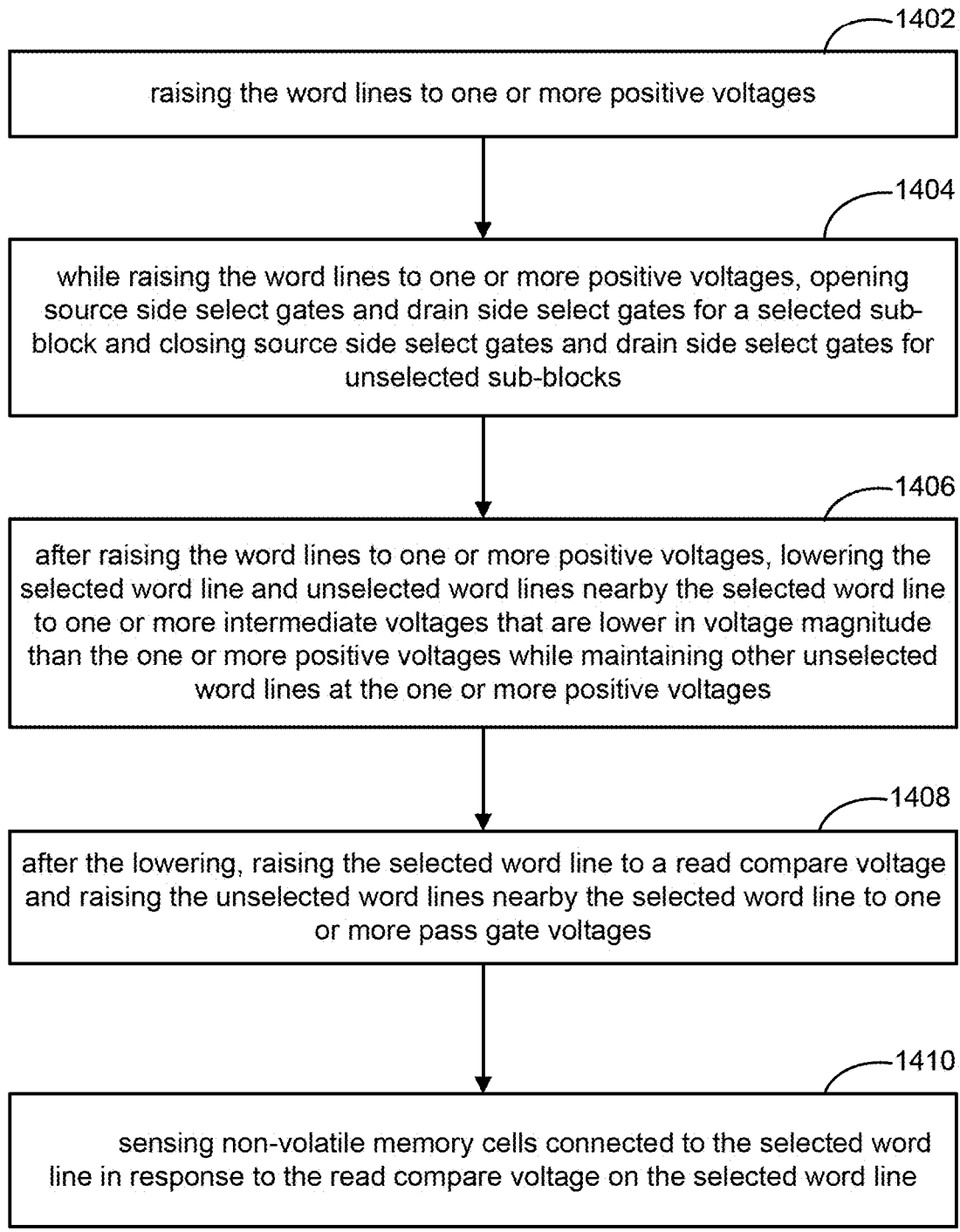
FIG. 14 is a flow chart describing one embodiment of a process for reading data.

FIG. 14 is a flow chart describing one embodiment of a process for reading data in accordance with the proposal to remove the voltage spike on unselected drain side select lines and unselected source side select lines to prevent unnecessary current being drawn and adjusting the voltage applied to unselected word lines nearby the selected word line in order to create a channel potential gradient in NAND strings of unselected sub-blocks that avoids Read Disturb. The process of FIG. 14 is another embodiment of the process of FIG. 11. The process of FIG. 14 is an example implementation of steps 704 and 706 of FIG. 7. The process of FIG. 14 can be performed by any one of the one or more control circuits discussed above connected to one or more memory arrays (or other memory structures) as discussed above. For example, the process of FIG. 14 can be performed by the one or more control circuits discussed above on memory die 200 (see FIG. 2A) or on integrated memory assembly 207 (see FIG. 2B). In one example, the process of FIG. 14 is performed by or at the direction of state machine 262, using other components of System Control Logic 260, Column Control Circuitry 210 and Row Control Circuitry 220. The process of FIG. 14 can be performed by any one of the control circuits discussed above connected to a block of non-volatile memory cells arranged as NAND strings, where the block includes multiple sub-blocks and a plurality of word lines connected to NAND strings of all sub-blocks of the block, and the control circuit is configured to read data from a plurality non-volatile memory cells connected to a selected word line and on a plurality NAND strings of a selected sub-block by performing the process of FIG. 14. In one set of embodiments, the word lines are connected to NAND strings of a block of non-volatile memory cells of the non-volatile memory structure, the NAND strings have drain side select gates and source side select gates, the block includes multiple sub-blocks, the word lines are connected to NAND strings of all sub-blocks of the block, the source side select gates for each sub-block can be controlled independently from source side select gates for other sub-blocks of the block.

In step 1402 of FIG. 14, the control circuit raises the word lines to one or more positive voltages (e.g., corresponding to t0-t2 of FIG. 12). In step 1404, while raising the word lines to one or more positive voltages in step 1402, the control circuit opens source side select gates and drain side select gates for a selected sub-block and closes source side select gates and drain side select gates for unselected sub-blocks (see e.g., SGD, SGS unselected and SGS selected of FIG. 12). In step 1406, after raising the word lines to one or more positive voltages in step 1402, the control circuit lowers the selected word line and unselected word lines nearby the selected word line to one or more intermediate voltages that are lower in voltage magnitude than the one or more positive voltages while maintaining other unselected word lines at the one or more positive voltages (e.g., corresponding to t2-t3 of FIG. 12). In step 1408, after the lowering the voltages in step 1406, the control circuit raises the selected word line to a read compare voltage and raises the unselected word lines nearby the selected word line to one or more pass gate voltages (e.g., corresponding to t3-t5 of FIG. 12). In step 1410, the selected non-volatile memory cells connected to the selected word line are sensed in response to the read compare voltage on the selected word line.

Figure 15:
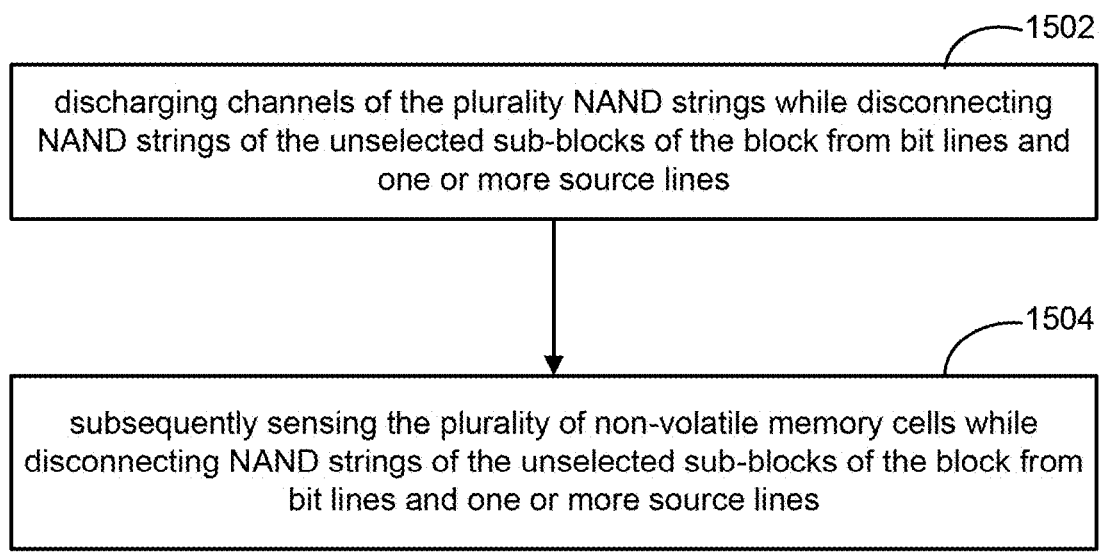
FIG. 15 is a flow chart describing one embodiment of a process for reading data.

FIG. 15 is a flow chart describing one embodiment of a process for reading data in accordance with the proposal to remove the voltage spike on unselected drain side select lines and unselected source side select lines to prevent unnecessary current being drawn and adjusting the voltage applied to unselected word lines nearby the selected word line in order to create a channel potential gradient in NAND strings of unselected sub-blocks that avoids Read Disturb. The process of FIG. 15 is another embodiment of the process of FIG. 11. The process of FIG. 15 is an example implementation of steps 704 and 706 of FIG. 7. The process of FIG. 15 can be performed by any one of the one or more control circuits discussed above connected to one or more memory arrays (or other memory structures) as discussed above. For example, the process of FIG. 15 can be performed by the one or more control circuits discussed above on memory die 200 (see FIG. 2A) or on integrated memory assembly 207 (see FIG. 2B). In one example, the process of FIG. 15 is performed by or at the direction of state machine 262, using other components of System Control Logic 260, Column Control Circuitry 210 and Row Control Circuitry

220. In step 1502 of FIG. 15, the control circuit discharges channels of the plurality of NAND strings in the selected sub-block while disconnecting NAND strings of the unselected sub-blocks of the same block from bit lines and one or more source lines. In step 1504, the control circuit subsequently (i.e., after step 1502) senses the plurality of non-volatile memory cells while disconnecting NAND strings of the unselected sub-blocks from bit lines and one or more source lines.

FIG. 16 is a flow chart describing one embodiment of a process for discharging channels of the plurality of NAND strings in the selected sub-block while disconnecting NAND strings of the unselected sub-blocks from bit lines and one or more source lines. Thus, the process of FIG. 16 is one example implementation of step 1502 of FIG. 15. In step 1602, the control circuit increases a voltage of the selected word line from a first initial voltage to a first peak voltage and subsequently decreases the voltage of the selected word line to a first intermediate voltage. For example, step 1602 corresponds to the Vread_SPIKE of WLn selected during t0-t3 of FIG. 12. In step 1604, the control circuit increases voltages of a first set of unselected word lines nearby the selected word line from respective second initial voltages to respective second peak voltages and subsequently decrease the voltages of the first set of unselected word lines to respective second intermediate voltages. For example, step 1604 corresponds to WLn+/−(1-2) during t0-t3 of FIG. 12. In step 1606, the control circuit increases voltages of a second set of unselected word lines nearby the selected word line from respective third initial voltages to respective third peak voltages and subsequently decrease the voltages of the second set of unselected word lines to respective third intermediate voltages. For example, step 1606 corresponds to WLn+/−(3-4) during t0-t3 of FIG. 12. Note that, in some embodiments, the third intermediate voltages are higher in voltage magnitude than the second intermediate voltages, the second intermediate voltages are higher in voltage magnitude than the first intermediate voltage, and the first set of unselected word lines are positioned closer to the selected word line than the second set of unselected word lines. In step 1608, the control circuit increases voltages of unselected word lines not in the first set of unselected word lines or the second set of unselected word lines to respective pass gate voltages. For example, step 1608 corresponds to Other WLs during t0-t3 of FIG. 12.

FIG. 17 is a flow chart describing of a process of sensing the plurality of selected non-volatile memory cells while disconnecting NAND strings of the unselected sub-blocks of the same block from bit lines and one or more source lines. Thus, the process of FIG. 17 is one example implementation of step 1504 of FIG. 15. In step 1702, the control circuit increases the voltage of the selected word line from the first intermediate voltage to a read compare voltage. For example, step 1702 corresponds to WLn during t3-t5 of FIG. 12. In step 1704, the control circuit increases voltages of the first set of unselected word lines and the second set of unselected word lines to respective pass gate voltages. For example, step 1704 corresponds to WLn+/−(1-2) and WLn+/−(3-4) during t3-t5 of FIG. 12. In step 1706, the control circuit senses the plurality non-volatile memory cells (e.g., after t5 of FIG. 12).

A non-volatile memory has been described that performs a read process using less power and reduces program disturb.

One embodiment includes a non-volatile storage apparatus, comprising: a block of non-volatile memory cells arranged as NAND strings, the block includes multiple sub-blocks and a plurality of word lines connected to NAND strings of all sub-blocks of the block; and a control circuit connected to the block. The control circuit is configured to read data from a plurality non-volatile memory cells connected to a selected word line and on a plurality NAND strings of a selected sub-block by: raising word line voltages for word lines connected to NAND strings of the block; after the raising word line voltages, lowering the selected word line and unselected word lines nearby the selected word line to respective intermediate voltages; after the lowering, raising the selected word line to a read compare voltage and raising the unselected word lines nearby the selected word line to respective pass gate voltages; sensing the plurality non-volatile memory cells in response to the read compare voltage; and floating NAND strings of unselected sub-blocks during the raising word line voltages, the lowering, the raising the selected word line, and the raising the unselected word lines nearby the selected word line.

In one example implementation, the NAND strings comprise source side select gates and drain side select gates; and source side select gates for each sub-block can be controlled independently from source side select gates for other sub-blocks of the block.

In one example implementation, the NAND strings have drain side select gates and source side select gates, the source side select gates for each sub-block can be controlled independently from source side select gates for other sub-blocks of the block; and the floating NAND strings of unselected sub-blocks comprises: while raising word line voltages for word lines connected to NAND strings of the block, opening source side select gates and drain side select gates for a selected sub-block and closing source side select gates and drain side select gates for unselected sub-blocks.

In one example implementation, the control circuit is configured to lower the unselected word lines nearby the selected word line to respective intermediate voltages in order to create a channel potential gradient in NAND strings of unselected sub-blocks that includes a first channel voltage under WLn, a second channel voltage under WLn−1 and WLn−2, a third channel voltage under WLn−3 and WLn−4, and a fourth channel voltage under WLn−5 and WLn−6; and the fourth channel voltage>the third channel voltage>the second channel voltage>the first channel voltage.

One embodiment includes a method of reading data from a non-volatile memory structure. The method comprises: raising the word lines to one or more positive voltages, the word lines are connected to NAND strings of a block of non-volatile memory cells of the non-volatile memory structure, the NAND strings have drain side select gates and source side select gates, the block includes multiple sub-blocks, the word lines are connected to NAND strings of all sub-blocks of the block, the source side select gates for each sub-block can be controlled independently from source side select gates for other sub-blocks of the block; while raising the word lines to one or more positive voltages, opening source side select gates and drain side select gates for a selected sub-block and closing source side select gates and drain side select gates for unselected sub-blocks; after raising the word lines to one or more positive voltages, lowering the selected word line and unselected word lines nearby the selected word line to one or more intermediate voltages that are lower in voltage magnitude than the one or more positive voltages while maintaining other unselected word lines at the one or more positive voltages; after the lowering, raising the selected word line to a read compare voltage and raising the unselected word lines nearby the selected word line to one or more pass gate voltages; sensing non-volatile memory cells connected to the selected word line in response to the read compare voltage on the selected word line.

One embodiment includes a non-volatile storage apparatus, comprising: a block of non-volatile memory cells arranged as NAND strings, the block includes multiple sub-blocks and a plurality of word lines connected to NAND strings of all sub-blocks of the block; and a control circuit connected to the block that is configured to read data from a plurality non-volatile memory cells connected to a selected word line and on a plurality NAND strings of a selected sub-block by discharging channels of the plurality NAND strings and subsequently sensing the plurality of non-volatile memory cells while disconnecting NAND strings of the unselected sub-blocks of the block from bit lines and one or more source lines. To discharge the channels of the plurality NAND strings, the control circuit is configured to: increase a voltage of the selected word line from a first initial voltage to a first peak voltage and subsequently decrease the voltage of the selected word line to a first intermediate voltage; increase voltages of a first set of unselected word lines nearby the selected word line from respective second initial voltages to respective second peak voltages and subsequently decrease the voltages of the first set of unselected word lines to respective second intermediate voltages; increase voltages of a second set of unselected word lines nearby the selected word line from respective third initial voltages to respective third peak voltages and subsequently decrease the voltages of the second set of unselected word lines to respective third intermediate voltages, the third intermediate voltages are higher in voltage magnitude than the second intermediate voltages, the second intermediate voltages are higher in voltage magnitude than the first intermediate voltage, the first set of unselected word lines are positioned closer to the selected word line than the second set of unselected word lines; and increase voltages of unselected word lines not in the first set of unselected word lines or the second set of unselected word lines to respective pass gate voltages. To sense the plurality of non-volatile memory cells, the control circuit is configured to increase the voltage of the selected word line from the first intermediate voltage to a read compare voltage, increase voltages of the first set of unselected word lines and the second set of unselected word lines to respective pass gate voltages, and sense the plurality non-volatile memory cells.

One embodiment includes a non-volatile storage apparatus, comprising: a non-volatile memory structure comprising a block of non-volatile memory cells arranged as NAND strings, the block includes multiple sub-blocks, each sub-block of the block includes a separate drain side select line for the respective sub-block that is connected to the drain side select gates of NAND strings for the respective sub-block and a separate source side select line for the respective sub-block that is connected to the drain side select gates of NAND strings for the respective sub-block, the block further comprises a plurality of word lines connected to all NAND strings of all sub-blocks of the block; and a control circuit connected to the non-volatile memory structure. The control circuit is configured to read data from non-volatile memory cells of a selected sub-block of the multiple sub-blocks by: maintaining source side select lines and drain side select lines for unselected sub-blocks at a voltage that turns off respective connected drain side select gates and source side select gates; maintaining a source side select line and a drain side select line for the selected sub-block at a voltage that turns on a respective connected drain side select gate and a respective connected source side select gate; raising all word lines to a first voltage; lowering a selected word line from the first voltage to a second voltage while lowering a first set of unselected word lines near the selected word line from the first voltage to a third voltage and lowering a second set of unselected word lines near the selected word line from the first voltage to a fourth voltage such that the second voltage is lower than the third voltage and the third voltage is lower than the fourth voltage; raising the first set of unselected word lines and the second set of unselected word lines to one or more pass voltages; raising the selected word line to a read compare voltage such that the selected word line is at the read compare voltage while the first set of unselected word lines and the second set of unselected word lines are at the one or more pass voltages; and sensing non-volatile memory cells connected to the selected word line in response to the read compare voltage.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a block of non-volatile memory cells arranged as NAND strings, the block includes multiple sub-blocks and a plurality of word lines connected to NAND strings of all sub-blocks of the block; and
a control circuit connected to the block, the control circuit is configured to read data from a plurality of non-volatile memory cells connected to a selected word line and on a plurality of NAND strings of a selected sub-block by:
raising voltages of word lines connected to NAND strings of the block, the word lines including the selected word line and unselected word lines, after the raising of voltages of word lines connected to NAND strings of the block, lowering a voltage of the selected word line and voltages of unselected word lines nearby the selected word line to respective intermediate voltages, after the lowering of the voltage of the selected word line and voltages of unselected word lines, raising the voltage of the selected word line to a read compare voltage and raising voltages of the unselected word lines nearby the selected word line to respective pass gate voltages, sensing the plurality of non-volatile memory cells in response to the read compare voltage, and floating NAND strings of unselected sub-blocks during the raising of voltages of word lines connected to NAND strings of the block, the lowering of a voltage of the selected word line and voltages of unselected word lines nearby the selected word line to respective intermediate voltages, the raising of the voltage of the selected word line to the read compare voltage, and the raising of voltages of the unselected word lines nearby the selected word line to respective pass gate voltages.

2. The non-volatile storage apparatus of claim 1, wherein:
the block further comprises bit lines and one or more source lines; and
the control circuit is configured to float NAND strings of unselected sub-blocks by cutting off the NAND strings of unselected sub-blocks from the bit lines and the one or more source lines.

3. The non-volatile storage apparatus of claim 1, wherein:
the NAND strings comprise source side select gates and drain side select gates; and
source side select gates for each sub-block can be controlled independently from source side select gates for other sub-blocks of the block.

4. The non-volatile storage apparatus of claim 3, wherein:
the block further comprises a separate drain side select line for each sub-block that is connected to the drain side select gates for the respective sub-block and a separate source side select line for each sub-block that is connected to the source side select gates for the respective sub-block; and
the control circuit is configured to float NAND strings of unselected sub-blocks by asserting a signal on the source side select lines for the of unselected sub-blocks to turn off the source side select gates for the of unselected sub-blocks.

5. The non-volatile storage apparatus of claim 1, wherein:
the control circuit is configured to raise word line voltages for word lines connected to NAND strings of the block by raising all word lines to the pass gate voltage.

6. The non-volatile storage apparatus of claim 5, wherein:
the control circuit is configured to lower the voltage of the selected word line and voltages of the unselected word lines nearby the selected word line to respective intermediate voltages by lowering the voltage of the selected word line from the pass gate voltage to a first intermediate voltage while lowering voltages of a first set of the unselected word lines nearby the selected word line from the pass gate voltage to a second intermediate voltage and lowering voltages of a second set of unselected word lines nearby the selected word line from the pass gate voltage to a third intermediate voltage such that the first intermediate voltage is lower than the second intermediate voltage and the second intermediate voltage is lower than the third intermediate voltage.

7. The non-volatile storage apparatus of claim 1, wherein:
the control circuit is configured to lower the voltage of the selected word line and voltages of the unselected word lines nearby the selected word line to respective intermediate voltages by lowering the voltage of the selected word line to a first intermediate voltage while lowering voltages of a first set of the unselected word lines nearby the selected word line to a second intermediate voltage and lowering voltages of a second set of unselected word lines nearby the selected word line to a third intermediate voltage such that the first intermediate voltage is lower than the second intermediate voltage and the second intermediate voltage is lower than the third intermediate voltage.

8. The non-volatile storage apparatus of claim 7, wherein:
the first set of the unselected word lines nearby the selected word line comprise $WLn-1$, $WLn-2$, $WLn+1$ and $WLn+2$; and
the second set of the unselected word lines nearby the selected word line comprise $WLn-3$, $WLn-4$, $WLn+3$ and $WLn+4$, wherein $WLn$ is the selected word line.

9. The non-volatile storage apparatus of claim 7, wherein:
the control circuit is configured to raise the voltage of the selected word line to the read compare voltage by first raising the voltage of the selected word line to a voltage higher than the read compare voltage by a predetermined percentage of the read compare voltage and then letting the voltage of the selected word line settle down to the read compare voltage.

10. The non-volatile storage apparatus of claim 1, wherein:
the block includes bit lines connected to the NAND strings and one or more source lines connected to the NAND strings;
the control circuit is configured to read data from the plurality of non-volatile memory cells connected to the selected word line and in a plurality of NAND strings of a selected sub-block by discharging channels of the plurality of NAND strings and subsequently sensing the plurality of non-volatile memory cells while disconnecting NAND strings of the unselected sub-blocks of the block from bit lines and one or more source lines; and
the discharging channels comprises the raising word line voltages for word lines connected to NAND strings of the selected block and lowering the voltage of the selected word line and voltages of the unselected word lines nearby the selected word line to respective intermediate voltages.

11. The non-volatile storage apparatus of claim 1, wherein:
the NAND strings have drain side select gates and source side select gates, the source side select gates for each sub-block can be controlled independently from source side select gates for other sub-blocks of the block; and
the floating NAND strings of unselected sub-blocks comprises: while raising word line voltages for word lines connected to NAND strings of the block, opening source side select gates and drain side select gates for a selected sub-block and closing source side select gates and drain side select gates for unselected sub-blocks.

12. The non-volatile storage apparatus of claim 1, wherein:
the control circuit is configured to lower the voltages of the unselected word lines nearby the selected word line to respective intermediate voltages in order to create a channel potential gradient in NAND strings of unselected sub-blocks that avoids read disturb.

13. The non-volatile storage apparatus of claim 1, wherein:
the control circuit is configured to lower the voltages of the unselected word lines nearby the selected word line to respective intermediate voltages in order to create a channel potential gradient in NAND strings of unselected sub-blocks that includes a slower increase in voltage from below the selected word line outward than if the unselected word lines nearby the selected word line were to be at the pass gate voltage.

14. The non-volatile storage apparatus of claim 1, wherein:
the control circuit is configured to lower the voltages of the unselected word lines nearby the selected word line to respective intermediate voltages in order to create a channel potential gradient in NAND strings of unselected sub-blocks that includes a first channel voltage under WLn, a second channel voltage under WLn-1 and WLn-2, a third channel voltage under WLn-3 and WLn-4, and a fourth channel voltage under WLn-5 and WLn-6, wherein WLn is the selected word line; and
the fourth channel voltage >the third channel voltage >the second channel voltage >the first channel voltage.

15. The non-volatile storage apparatus of claim 1, wherein:
the block of non-volatile memory cells is part of a three dimensional memory structure on a memory die; and
the control circuit is positioned on a control die that is separate from and bonded to the memory die.

16. A method of reading data from a non-volatile memory structure, the method comprising:
raising voltages of word lines to one or more positive voltages, the word lines including a selected word line and unselected word lines, the word lines are connected to NAND strings of a block of non-volatile memory cells of the non-volatile memory structure, the NAND strings have drain side select gates and source side select gates, the block includes multiple sub-blocks, the word lines are connected to NAND strings of all sub-blocks of the block, the source side select gates for each sub-block can be controlled independently from source side select gates for other sub-blocks of the block;
while raising the voltages of the word lines to one or more positive voltages, turning on source side select gates and drain side select gates of a selected sub-block and turning off source side select gates and drain side select gates of unselected sub-blocks;
after raising the voltages of the word lines to one or more positive voltages, lowering the voltages of the selected word line and unselected word lines nearby the selected word line to one or more intermediate voltages that are lower in voltage magnitude than the one or more positive voltages while maintaining other unselected word lines at the one or more positive voltages;
after the lowering of the voltages of the selected word line and unselected word lines nearby the selected word line, raising the voltage of the selected word line to a read compare voltage and raising the voltage of the unselected word lines nearby the selected word line to one or more pass gate voltages; and
sensing non-volatile memory cells connected to the selected word line in response to the read compare voltage on the selected word line.

17. The method of claim 16, wherein:
the raising of the voltages of the word lines to one or more positive voltages comprises raising the voltages of all word lines of the block to respective pass gate voltages; and
the lowering of voltages of the selected word line and unselected word lines nearby the selected word line to one or more intermediate voltages comprises lowering the voltage of the selected word line to a first intermediate voltage while lowering the voltages of a first set of the unselected word lines nearby the selected word line to a second intermediate voltage and lowering the voltages of a second set of unselected word lines nearby the selected word line to a third intermediate voltage such that the first intermediate voltage is lower than the second intermediate voltage and the second intermediate voltage is lower than the third intermediate voltage.

18. The method pf claim 17, wherein:
the closing source side select gates and drain side select gates for unselected sub-blocks causes NAND strings of unselected sub-blocks to float and channels of the NAND strings of unselected sub-blocks to become boosted in response to the raising the word lines to respective pass gate voltages.

19. A non-volatile storage apparatus, comprising:
a block of non-volatile memory cells arranged as NAND strings, the block includes multiple sub-blocks and a plurality of word lines connected to NAND strings of all sub-blocks of the block; and
a control circuit connected to the block and configured to read data from a plurality non-volatile memory cells, which are connected to a selected word line and in a plurality of NAND strings of a selected sub-block, by discharging channels of the plurality NAND strings, and subsequently sensing the plurality of non-volatile memory cells while disconnecting NAND strings of the unselected sub-blocks of the block from bit lines and one or more source lines
wherein the control circuit is configured to:
increase a voltage of the selected word line from a first initial voltage to a first peak voltage and subsequently decrease the voltage of the selected word line to a first intermediate voltage,
increase voltages of a first set of unselected word lines nearby the selected word line from respective second initial voltages to respective second peak voltages and subsequently decrease the voltages of the first set of unselected word lines to respective second intermediate voltages,
increase voltages of a second set of unselected word lines nearby the selected word line from respective third initial voltages to respective third peak voltages and subsequently decrease the voltages of the second set of unselected word lines to respective third intermediate voltages, the third intermediate voltages are higher in voltage magnitude than the second intermediate voltages, the second intermediate voltages are higher in voltage magnitude than the first intermediate voltage, the first set of unselected word lines are positioned closer to the selected word line than the second set of unselected word lines,
increase voltages of unselected word lines not in the first set of unselected word lines or the second set of unselected word lines to respective pass gate voltages, and
sense the plurality of non-volatile memory cells by increasing the voltage of the selected word line from the first intermediate voltage to a read compare voltage, increasing voltages of the first set of unselected word lines and the second set of unselected word lines to respective pass gate voltages, and sensing the plurality non-volatile memory cells.

20. The non-volatile storage apparatus of claim 19, wherein:
- the NAND strings include drain side select gates and source side select gates;
- each sub-block includes a separate drain side select line for the respective sub-block that is connected to the drain side select gates of NAND strings for the respective sub-block and a separate source side select line for the respective sub-block that is connected to the drain side select gates of NAND strings for the respective sub-block;
- the first initial voltage, the second initial voltages and the third initial voltages are all 0 volts; and
- the first peak voltage, the respective second peak voltages and the respective third peak voltages are at a same voltage magnitude.

* * * * *